US009998097B2

(12) United States Patent
Takeuchi et al.

(10) Patent No.: US 9,998,097 B2
(45) Date of Patent: Jun. 12, 2018

(54) RADIO-FREQUENCY FRONT-END CIRCUIT AND COMMUNICATION DEVICE

(71) Applicant: Murata Manufacturing Co., Ltd., Nagaokakyo-shi, Kyoto-fu (JP)

(72) Inventors: Morio Takeuchi, Nagaokakyo (JP); Daisuke Miyazaki, Nagaokakyo (JP); Tetsuro Okuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days. days.

(21) Appl. No.: 15/646,334

(22) Filed: Jul. 11, 2017

(65) Prior Publication Data
US 2018/0019730 A1 Jan. 18, 2018

(30) Foreign Application Priority Data

Jul. 15, 2016 (JP) ................................ 2016-140916
Apr. 25, 2017 (JP) ................................ 2017-086232

(51) Int. Cl.
| | | |
|---|---|---|
| H03H 9/70 | (2006.01) | |
| H04B 1/40 | (2015.01) | |
| H03H 9/58 | (2006.01) | |
| H03H 9/205 | (2006.01) | |
| H03H 9/02 | (2006.01) | |

(52) U.S. Cl.
CPC ............ *H03H 9/70* (2013.01); *H03H 9/0211* (2013.01); *H03H 9/205* (2013.01); *H03H 9/582* (2013.01); *H04B 1/40* (2013.01)

(58) Field of Classification Search
CPC ......... H03H 9/70–9/725; H04B 1/0053–1/006
See application file for complete search history.

(56) References Cited

U.S. PATENT DOCUMENTS

| | | | | |
|---|---|---|---|---|
| 6,445,262 B1 * | 9/2002 | Tanaka | ................... | H03H 7/463 333/101 |
| 6,766,149 B1 * | 7/2004 | Hikita | .................. | H03H 9/0576 333/100 |
| 7,057,472 B2 * | 6/2006 | Fukamachi | .......... | H03H 7/0115 333/101 |
| 8,805,299 B2 * | 8/2014 | Uejima | .................. | H03H 7/463 455/552.1 |
| 9,680,444 B2 * | 6/2017 | Nishimura | ............. | H03H 7/463 |
| 9,838,046 B2 * | 12/2017 | Lum | .................... | H04B 1/0057 |
| 9,860,006 B1 * | 1/2018 | Okuda | .................... | H04J 3/247 |
| 2015/0303973 A1 | 10/2015 | Wloczysiak | | |

FOREIGN PATENT DOCUMENTS

JP         2015-208007 A        11/2015

* cited by examiner

*Primary Examiner* — Dean Takaoka
*Assistant Examiner* — Alan Wong
(74) *Attorney, Agent, or Firm* — Keating & Bennett, LLP

(57) ABSTRACT

A radio-frequency front-end circuit includes a first filter that has a first pass band and is connected to an antenna common terminal, a second filter that has a second pass band and is connected to the antenna common terminal, a switch that includes a common terminal and selection terminals, the common terminal being connected to the first filter, and a third filter that is connected to one of the selection terminals and is disposed between the switch and an input/output terminal. A reflection coefficient of the first filter alone in the second pass band viewed from the antenna common terminal is larger than a reflection coefficient of the third filter alone in the second pass band viewed from the antenna common terminal.

30 Claims, 15 Drawing Sheets

FIG. 2
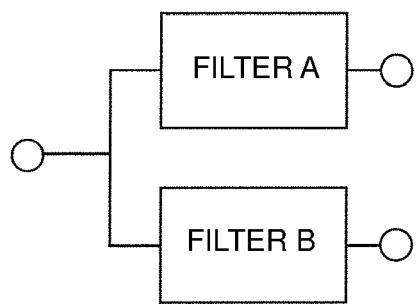
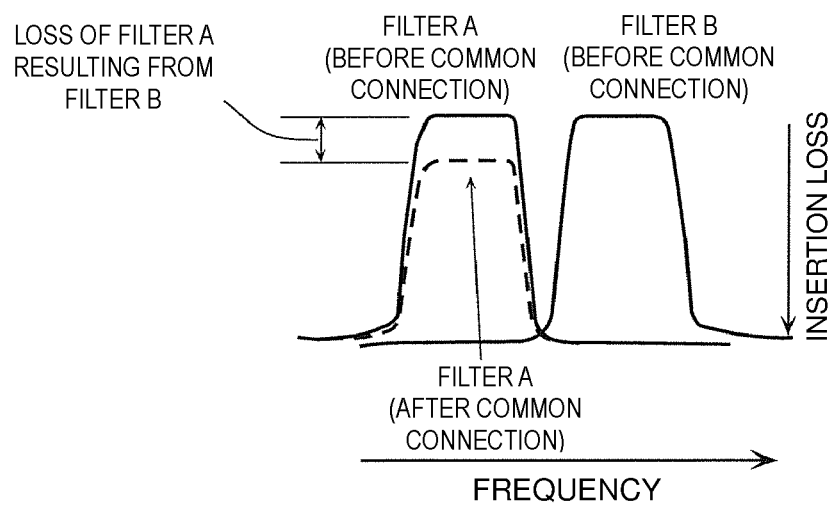

| FIRST FILTER 11 | THIRD FILTER 13 |
|---|---|
| USE LN RAYLEIGH WAVE | SMR |
| | FBAR |
| USE LT LEAKY WAVE | SMR |
| | FBAR |
| USE LN LOVE WAVE | SMR |
| | FBAR |
| ACOUSTIC-VELOCITY-FILM MULTILAYER STRUCTURE | SMR |
| | FBAR |

RL IN LOW BAND 1 < RL IN LOW BAND 1

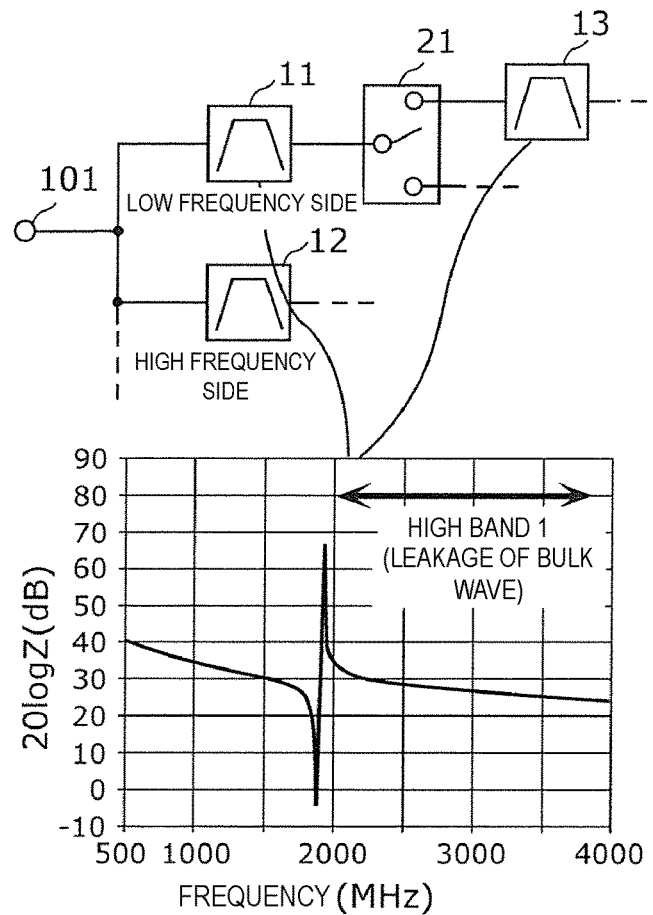

| FIRST FILTER 11 | THIRD FILTER 13 |
|---|---|
| USE LN RAYLEIGH WAVE | ACOUSTIC-VELOCITY-FILM MULTILAYER STRUCTURE |
| USE LT LEAKY WAVE | |
| USE LN LOVE WAVE | |
| SMR | |
| FBAR | |
| USE LN RAYLEIGH WAVE | USE LT LEAKY WAVE |
| ACOUSTIC-VELOCITY-FILM MULTILAYER STRUCTURE | |
| USE LN LOVE WAVE | |
| SMR | |
| FBAR | |

RL IN LOW BAND 2 < RL IN LOW BAND 2

| FIRST FILTER 11 | THIRD FILTER 13 |
|---|---|
| ACOUSTIC-VELOCITY-FILM MULTILAYER STRUCTURE | USE LN RAYLEIGH WAVE |
| USE LT LEAKY WAVE | |
| USE LN LOVE WAVE | |
| SMR | |
| FBAR | |
| USE LN RAYLEIGH WAVE | USE LN LOVE WAVE |
| ACOUSTIC-VELOCITY-FILM MULTILAYER STRUCTURE | |
| USE LT LEAKY WAVE | |
| SMR | |
| FBAR | |

RL IN HIGH BAND 2 < RL IN HIGH BAND 2

FIG. 11A

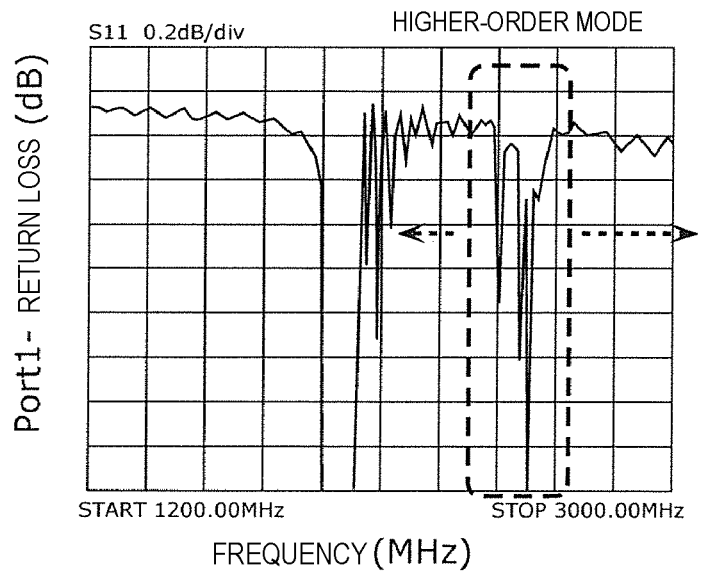

FIG. 11B

| ELASTIC WAVE MODE | STRUCTURAL PARAMETER |
|---|---|
| USE LT LEAKY WAVE | IDT ELECTRODE FILM THICKNESS |
| | DUTY RATIO |
| ACOUSTIC-VELOCITY-FILM MULTILAYER STRUCTURE | IDT ELECTRODE FILM THICKNESS |
| | DUTY RATIO |
| | LOW-ACOUSTIC-VELOCITY FILM |

SPURIOUS RAYLEIGH WAVE

FIG. 11C

| ELASTIC WAVE MODE | STRUCTURAL PARAMETER |
|---|---|
| USE LN RAYLEIGH WAVE | IDT ELECTRODE FILM THICKNESS |
| | PROTECTIVE FILM |
| | DUTY RATIO |
| USE LN LOVE WAVE | IDT ELECTRODE FILM THICKNESS |
| | PROTECTIVE FILM |
| | DUTY RATIO |
| ACOUSTIC-VELOCITY-FILM MULTILAYER STRUCTURE | LT FILM THICKNESS |
| | LOW-ACOUSTIC-VELOCITY FILM |
| | Si CRYSTAL ORIENTATION |

HIGHER-ORDER MODE

FIG. 12
| ELASTIC WAVE MODE | STRUCTURAL PARAMETER |
|---|---|
| USE LT LEAKY WAVE | IDT ELECTRODE FILM THICKNESS |
| USE LN LOVE WAVE | IDT ELECTRODE FILM THICKNESS |
BULK WAVE
FIG. 13A
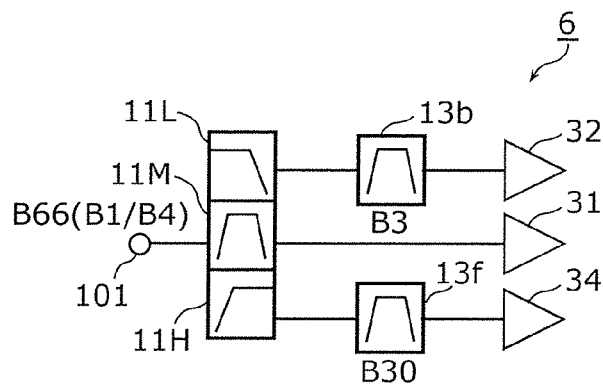
FIG. 13B
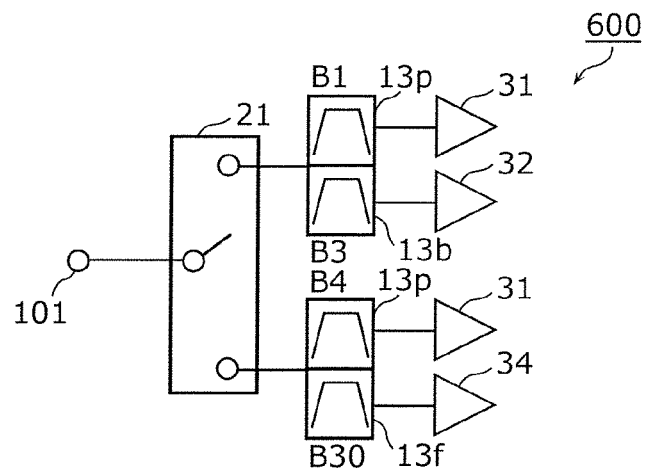

RADIO-FREQUENCY FRONT-END CIRCUIT AND COMMUNICATION DEVICE

CROSS REFERENCE TO RELATED APPLICATIONS

This application claims the benefit of priority to Japanese Patent Application No. 2017-086232 filed on Apr. 25, 2017 and Japanese Patent Application No. 2016-140916 filed on Jul. 15, 2016. The entire contents of these applications are hereby incorporated herein by reference.

BACKGROUND OF THE INVENTION

1. Field of the Invention

The present invention relates to a radio-frequency (RF) front-end circuit and a communication device.

2. Description of the Related Art

There is a demand for recent cellular phones to be compatible with a plurality of frequencies and a plurality of radio systems in a single terminal (to have multiband and multimode functions). There is a demand for front-end modules with multiband and multimode functions to process a plurality of transmission and reception signals at high speed without causing quality degradation. In particular, there is a demand for the front-end modules to perform carrier aggregation (CA) for simultaneously transmitting and receiving RF signals in a plurality of bands.

Japanese Unexamined Patent Application Publication No. 2015-208007 discloses an RF system including a low band (LB) diversity antenna, a middle band (MB)/high band (HB) diversity antenna, and a diversity module (see FIG. 6 in the publication). The diversity module includes a single-pole multi-throw (SPMT) switch connected to the MB/HB diversity antenna, a plurality of filters connected to the SPMT switch, and an amplifying circuit connected to the plurality of filters. The plurality of filters have respective pass bands. This configuration enables a CA operation in which RF signals in a plurality of bands are simultaneously used to perform communication.

In the RF system described in Japanese Unexamined Patent Application Publication No. 2015-208007, in the case of causing two or more filters to perform a CA operation, it is necessary in one of the filters to make the pass band(s) of the other filter(s) open. Accordingly, RF signals can propagate with low loss during the CA operation, with the one filter not being affected by the impedance of the other filter(s).

However, if the number of combinations of bands where a CA operation is performed increases and if there are a plurality of such combinations, the necessity for adjusting the impedance of each filter for each combination of bands arises, the design of each filter becomes complicated, and it becomes difficult to optimize the filter characteristics of all filters. Furthermore, the number of selection terminals in an SPMT switch increases as the number of combinations of bands where a CA operation is performed increases, and accordingly the size of the SPMT switch increases.

SUMMARY OF THE INVENTION

Accordingly, preferred embodiments of the present invention provide compact RF front-end circuits and communication devices that are capable of maintaining low-loss signal propagation characteristics even during a CA operation.

According to a preferred embodiment of the present invention, a radio-frequency front-end circuit includes an antenna common terminal connected to an antenna element; a first input/output terminal and a second input/output terminal; a first filter that includes a first terminal and a second terminal and has a first pass band, the first terminal being connected to the antenna common terminal; a second filter that is connected to the antenna common terminal, is disposed between the antenna common terminal and the second input/output terminal, and has a second pass band different from the first pass band; a switch that includes a common terminal and a plurality of selection terminals, the common terminal being connected to the second terminal; and a third filter that is connected to a first selection terminal among the plurality of selection terminals and is disposed between the switch and the first input/output terminal. A reflection coefficient of the first filter alone in the second pass band viewed from the antenna common terminal is larger than a reflection coefficient of the third filter alone in the second pass band viewed from the antenna common terminal.

In the configuration in which the first filter and the second filter defining a demultiplexing/multiplexing circuit are connected in common to the antenna common terminal, an insertion loss in the second pass band of the second filter is affected by reflection characteristics of the first filter viewed from the antenna common terminal, in addition to the insertion loss of the second filter alone. More specifically, the insertion loss in the second pass band of the second filter decreases as the reflection coefficient of the first filter in the second pass band viewed from the antenna common terminal increases.

In the above-described configuration, the reflection coefficient of the first filter in the second pass band is larger than the reflection coefficient of the third filter in the second pass band. Here, bandpass characteristics and attenuation characteristics of the filter take precedence over reflection characteristics in the third filter located in a subsequent stage of the first filter, and thus favorable bandpass characteristics of the first filter and the third filter is able to be obtained. That is, an insertion loss resulting from the first filter or/and the third filter in the total insertion loss in the second pass band of the second filter is effectively decreased without disposing a switch between the antenna element and the first and second filters, and thus a compact RF front-end circuit capable of maintaining low-loss signal propagation characteristics even during a CA operation is able to be provided.

Each of the first filter and the third filter may include two or more elastic wave resonators. A reflection coefficient of one or more elastic wave resonators alone disposed near the antenna common terminal among the two or more elastic wave resonators included in the first filter in the second pass band viewed from the antenna common terminal may be larger than a reflection coefficient of one or more elastic wave resonators alone disposed near the antenna common terminal among the two or more elastic wave resonators included in the third filter in the second pass band viewed from the antenna common terminal.

In a filter including a plurality of elastic wave resonators, a reflection coefficient viewed from the antenna common terminal is dominant in one elastic wave resonator that is nearest to the antenna common terminal. Accordingly, an insertion loss resulting from the first filter or/and the third filter in the total insertion loss in the second pass band of the second filter is effectively decreased.

At least one of the first filter and the third filter may have a ladder filter structure. The one or more elastic wave resonators disposed near the antenna common terminal may include at least one of a series-arm resonator and a parallel-arm resonator.

Accordingly, an insertion loss resulting from the first filter or/and the third filter in the total insertion loss in the second pass band of the second filter is able to be decreased while ensuring low-loss characteristics of the first filter and the third filter.

At least one of the first filter and the third filter may have a longitudinally coupled filter structure.

Accordingly, the first filter and the third filter are adapted to filter characteristics in which increased attenuation is required.

The second input/output terminal may be connected to a second amplifying circuit. No filter circuit may be disposed between the second filter and the second amplifying circuit.

Typically, a plurality of filters compatible with a plurality of bands that are included in the second pass band and are narrower than the second pass band are disposed in a subsequent stage of the second filter. However, no filter circuit may be disposed on a signal path of a band that does not need filter characteristics higher than the filter characteristics of the second filter, that is, between the second filter and the second amplifying circuit. Accordingly, the size of the RF front-end circuit is able to be further reduced.

The RF front-end circuit may further include a third input/output terminal; and a fourth filter that is connected to the antenna common terminal, is disposed between the antenna common terminal and the third input/output terminal, and has a third pass band. The first filter, the second filter, and the fourth filter may define a triplexer. The first pass band, the second pass band, and the third pass band may be applied to a low band (LB) of about 698-960 MHz, a middle band (MBa) of about 1710-2200 MHz, and a high band (HBa) of about 2300-2690 MHz, for example. The first pass band may be any one of the low band, the middle band, and the high band.

Accordingly, the first filter and the second filter are applied to a triplexer compatible with LB, MBa, and HBa. Thus, in the configuration including a triplexer compatible with LB, MBa, and HBa, a compact RF front-end circuit capable of maintaining low-loss signal propagation characteristics even during a CA operation is able to be obtained.

The RF front-end circuit may further include a third input/output terminal and a fourth input/output terminal; a fourth filter that is connected to the antenna common terminal, is disposed between the antenna common terminal and the third input/output terminal, and has a third pass band; and a fifth filter that is connected to the antenna common terminal, is disposed between the antenna common terminal and the fourth input/output terminal, and has a fourth pass band. The first filter, the second filter, the fourth filter, and the fifth filter may define a quadplexer. The first pass band, the second pass band, the third pass band, and the fourth pass band may be applied to a low band (LB) of about 698-960 MHz, a middle band (MBa) of about 1710-2200 MHz, a middle high band (MHBa) of about 2300-2400 MHz, and a high band (HBb) of about 2496-2690 MHz, for example. The first pass band may be any one of the low band, the middle band, the middle high band, and the high band.

Accordingly, the first filter and the second filter are applied to a quadplexer compatible with LB, MBa, MHBa, and HBb. Thus, in the configuration including a quadplexer compatible with LB, MBa, MHBa, and HBb, a compact RF front-end circuit capable of maintaining low-loss signal propagation characteristics even during a CA operation is able to be obtained.

The RF front-end circuit may further include a third input/output terminal and a fourth input/output terminal; a fourth filter that is connected to the antenna common terminal, is disposed between the antenna common terminal and the third input/output terminal, and has a third pass band; and a fifth filter that is connected to the antenna common terminal, is disposed between the antenna common terminal and the fourth input/output terminal, and has a fourth pass band. The first filter, the second filter, the fourth filter, and the fifth filter may define a quadplexer. The first pass band, the second pass band, the third pass band, and the fourth pass band may be applied to a middle low band (MLB) of about 1475.9-2025 MHz, a middle band (MBb) of about 2110-2200 MHz, a middle high band (MHBa or MHBb) of about 2300-2400 MHz or about 2300-2370 MHz, and a high band (HBb) of about 2496-2690 MHz, for example. The first pass band may be any one of the middle low band, the middle band, the middle high band, and the high band.

Accordingly, the first filter and the second filter are preferably applied to a quadplexer compatible with MLB, MBb, MHBa, and HBb. Thus, in the configuration including a quadplexer compatible with MLB, MBb, MHBa, and HBb, a compact RF front-end circuit capable of maintaining low-loss signal propagation characteristics even during a CA operation is able to be obtained.

The RF front-end circuit may further include a third input/output terminal and a fourth input/output terminal; a fourth filter that is connected to the antenna common terminal, is disposed between the antenna common terminal and the third input/output terminal, and has a third pass band; and a fifth filter that is connected to the antenna common terminal, is disposed between the antenna common terminal and the fourth input/output terminal, and has a fourth pass band. The first filter, the second filter, the fourth filter, and the fifth filter may define a quadplexer. The first pass band, the second pass band, the third pass band, and the fourth pass band may be applied to a middle low band (MLB) of about 1475.9-2025 MHz, a middle band (MBb) of about 2110-2200 MHz, a middle high band (MHBa or MHBb) of about 2300-2400 MHz or about 2300-2370 MHz, and a high band (HBb) of about 2496-2690 MHz, for example. The first pass band may be any one of the middle low band, the middle band, and the high band. The second pass band may be the middle high band. No filter circuit may be disposed on a signal path connecting the second filter and the second amplifying circuit.

Accordingly, the first filter and the second filter are preferably applied to a quadplexer compatible with MLB, MBb, MHBa, and HBb. In a case where the bandpass characteristics of the second filter are sufficient for the bandpass characteristics of the band included in MHBa, no filter circuit may be disposed on the signal path of the band. Thus, in the configuration including a quadplexer compatible with MLB, MBb, MHBa, and HBb, a more compact RF front-end circuit capable of maintaining low-loss signal propagation characteristics even during a CA operation is able to be obtained.

The signal path connecting the second filter and the second amplifying circuit may be a path that performs transmission and reception in Band 40a having a reception band of 2300-2370 MHz, for example.

Accordingly, the bandpass characteristics of the second filter are sufficient for the bandpass characteristics of Band 40a included in MHBa, and thus no filter circuit may be disposed on the signal path of Band 40a. Thus, in the configuration including a quadplexer compatible with MLB, MBb, MHBa, and HBb, a more compact RF front-end circuit capable of maintaining low-loss signal propagation characteristics even during a CA operation is able to be obtained.

The signal path connecting the second filter and the second amplifying circuit may be a path that performs transmission and reception in Band 40 having a reception band of 2300-2400 MHz, for example.

Accordingly, the bandpass characteristics of the second filter are sufficient for the bandpass characteristics of Band 40 included in MHBa, and thus no filter circuit may be disposed on the signal path of Band 40. Thus, in the configuration including a quadplexer compatible with MLB, MBb, MHBa, and HBb, a more compact RF front-end circuit capable of maintaining low-loss signal propagation characteristics even during a CA operation is able to be obtained.

The RF front-end circuit may further include a third input/output terminal and a fourth input/output terminal; a fourth filter that is connected to the antenna common terminal, is disposed between the antenna common terminal and the third input/output terminal, and has a third pass band; and a fifth filter that is connected to the antenna common terminal, is disposed between the antenna common terminal and the fourth input/output terminal, and has a fourth pass band. The first filter, the second filter, the fourth filter, and the fifth filter may define a quadplexer. The first pass band, the second pass band, the third pass band, and the fourth pass band may be applied to a middle low band (MLB) of about 1475.9-2025 MHz, a middle band (MBb) of about 2110-2200 MHz, a middle high band (MHBa or MHBb) of about 2300-2400 MHz or about 2300-2370 MHz, and a high band (HBb) of about 2496-2690 MHz. The first pass band may be any one of the middle low band, the middle band, and the middle high band. The second pass band may be the high band. No filter circuit may be disposed on a signal path connecting the second filter and the second amplifying circuit.

Accordingly, the first filter and the second filter are applied to a quadplexer compatible with MLB, MBb, MHBa, and HBb. In a case where the bandpass characteristics of the second filter are sufficient for the bandpass characteristics of the band included in HBb, no filter circuit may be disposed on the signal path of the band. Thus, in the configuration including a quadplexer compatible with MLB, MBb, MHBa, and HBb, a more compact RF front-end circuit capable of maintaining low-loss signal propagation characteristics even during a CA operation is able to be obtained.

The signal path connecting the second filter and the second amplifying circuit may be a path that performs transmission and reception in Band 41 having a reception band of 2496-2690 MHz, for example.

Accordingly, the bandpass characteristics of the second filter are sufficient for the bandpass characteristics of Band 41 included in HBb, and thus no filter circuit may be disposed on the signal path of Band 41. Thus, in the configuration including a quadplexer compatible with MLB, MBb, MHBa, and HBb, a more compact RF front-end circuit capable of maintaining low-loss signal propagation characteristics even during a CA operation is able to be obtained.

The first pass band may be on a high frequency side relative to the second pass band. Each of the first filter and the third filter may include one or more elastic wave resonators. Each of the one or more elastic wave resonators included in the first filter may be a surface acoustic wave resonator that includes a substrate including a piezoelectric layer and an interdigital transducer (IDT) electrode disposed on the substrate. In the first filter, any one of (1) a Rayleigh wave that propagates through the piezoelectric layer composed of $LiNbO_3$, (2) a leaky wave that propagates through the piezoelectric layer composed of $LiTaO_3$, and (3) a Love wave that propagates through the piezoelectric layer composed of $LiNbO_3$ may be used as a surface acoustic wave.

In a region on the low frequency side of the resonant point and anti-resonant point of the elastic wave resonator, a return loss is smaller when any one of a Rayleigh wave that propagates through the piezoelectric layer composed of $LiNbO_3$, a leaky wave that propagates through the piezoelectric layer composed of $LiTaO_3$, and a Love wave that propagates through the piezoelectric layer composed of $LiNbO_3$ is used as a surface acoustic wave than when another elastic wave is used.

Thus, in a case where the first filter defines and functions as a filter on the high frequency side and the second filter defines and functions as a filter on the low frequency side, it is possible to make the reflection coefficient of the first filter in the second pass band larger than the reflection coefficient of the third filter in the second pass band. Accordingly, an insertion loss resulting from the first filter or/and the third filter in the total insertion loss in the second pass band of the second filter is able to be decreased.

In the third filter, each of the one or more elastic wave resonators may be a solidly mounted resonator (SMR) or a film bulk acoustic resonator (FBAR).

Accordingly, a low loss and steepness in the pass band of the third filter is able to be ensured while increasing the reflection coefficient of the first filter.

The first pass band may be on a high frequency side relative to the second pass band. Each of the first filter and the third filter may include one or more elastic wave resonators. Each of the one or more elastic wave resonators included in the first filter may be a surface acoustic wave resonator that includes a substrate including a piezoelectric layer and an IDT electrode disposed on the substrate. In the first filter, each of the one or more elastic wave resonators may have an acoustic-velocity-film multilayer structure including (i) the piezoelectric layer including main surfaces, the IDT electrode being disposed on one of the main surfaces, (ii) a high-acoustic-velocity supporting substrate through which a bulk wave propagates at an acoustic velocity higher than an acoustic velocity of an elastic wave that propagates through the piezoelectric layer, and (iii) a low-acoustic-velocity film which is disposed between the high-acoustic-velocity supporting substrate and the piezoelectric layer and through which a bulk wave propagates at an acoustic velocity lower than an acoustic velocity of an elastic wave that propagates through the piezoelectric layer. In the third filter, each of the one or more elastic wave resonators may be an SMR or an FBAR.

In a region on the low frequency side of the resonant point and anti-resonant point of the elastic wave resonator, reflection coefficient is larger when the elastic wave resonator has the acoustic-velocity-film multilayer structure than when the elastic wave resonator is an SMR or an FBAR.

Thus, in a case where the first filter defines and functions as a filter on the high frequency side and the second filter defines and functions as a filter on the low frequency side, it is possible to make the reflection coefficient of the first filter in the second pass band larger than the reflection coefficient of the third filter in the second pass band. Accordingly, an insertion loss resulting from the first filter or/and the third filter in the total insertion loss in the second pass band of the second filter is able to be decreased. Also, a low loss and steepness in the pass band of the third filter is able to be ensured while increasing the reflection coefficient of the first filter.

The first pass band may be on a low frequency side relative to the second pass band. Each of the first filter and the third filter may include one or more elastic wave resonators. In the first filter, (1) a Rayleigh wave that propagates through a piezoelectric layer composed of $LiNbO_3$ may be used as a surface acoustic wave, (2) each of the one or more elastic wave resonators may be an SMR, or (3) each of the one or more elastic wave resonators may be an FBAR.

In a region on the high frequency side of the resonant point and anti-resonant point of the elastic wave resonator, an unnecessary wave resulting from leakage of a bulk wave is generated. The intensity of the unnecessary wave is able to be significantly reduced or minimized when a Rayleigh wave that propagates through a piezoelectric layer composed of $LiNbO_3$ is used as a surface acoustic wave, the elastic wave resonator is an SMR, or the elastic wave resonator is an FBAR.

Thus, in a case where the first filter defines and functions as a filter on the low frequency side and the second filter defines and functions as a filter on the high frequency side, it is possible to make the reflection coefficient of the first filter in the second pass band larger than the reflection coefficient of the third filter in the second pass band. Accordingly, an insertion loss resulting from the first filter or/and the third filter in the total insertion loss in the second pass band of the second filter is able to be decreased.

In the third filter, (1) each of the one or more elastic wave resonators may have an acoustic-velocity-film multilayer structure including (i) a piezoelectric layer including main surfaces, an IDT electrode being disposed on one of the main surfaces, (ii) a high-acoustic-velocity supporting substrate through which a bulk wave propagates at an acoustic velocity higher than an acoustic velocity of an elastic wave that propagates through the piezoelectric layer, and (iii) a low-acoustic-velocity film which is disposed between the high-acoustic-velocity supporting substrate and the piezoelectric layer and through which a bulk wave propagates at an acoustic velocity lower than an acoustic velocity of an elastic wave that propagates through the piezoelectric layer, (2) a leaky wave that propagates through the piezoelectric layer composed of $LiTaO_3$ may be used as a surface acoustic wave, or (3) a Love wave that propagates through the piezoelectric layer composed of $LiNbO_3$ may be used as a surface acoustic wave.

Accordingly, in a case where the third filter has the acoustic-velocity-film multilayer structure, a low loss and favorable temperature characteristics of the third filter is able to be ensured, with the reflection coefficient of the first filter being increased. Furthermore, in a case where a Love wave that propagates through a piezoelectric layer composed of $LiNbO_3$ is used as a surface acoustic wave in the third filter, a wide bandwidth is able to be ensured in the third filter.

The first pass band may be on a low frequency side relative to the second pass band. Each of the first filter and the third filter may include one or more elastic wave resonators. Each of the one or more elastic wave resonators included in the first filter and the third filter may be a surface acoustic wave resonator that includes a substrate including a piezoelectric layer and an IDT electrode disposed on the substrate. In the first filter, each of the one or more elastic wave resonators may have an acoustic-velocity-film multilayer structure including (i) the piezoelectric layer including main surfaces, the IDT electrode being disposed on one of the main surfaces, (ii) a high-acoustic-velocity supporting substrate through which a bulk wave propagates at an acoustic velocity higher than an acoustic velocity of an elastic wave that propagates through the piezoelectric layer, and (iii) a low-acoustic-velocity film which is disposed between the high-acoustic-velocity supporting substrate and the piezoelectric layer and through which a bulk wave propagates at an acoustic velocity lower than an acoustic velocity of an elastic wave that propagates through the piezoelectric layer. In the third filter, (1) a leaky wave that propagates through the piezoelectric layer composed of $LiTaO_3$ may be used as a surface acoustic wave or (2) a Love wave that propagates through the piezoelectric layer composed of $LiNbO_3$ may be used as a surface acoustic wave.

In a region on the high frequency side of the resonant point and anti-resonant point of the elastic wave resonator, an unnecessary wave resulting from leakage of a bulk wave is generated. The intensity of the unnecessary wave is able to be decreased more by adopting the acoustic-velocity-film multilayer structure than by using a leaky wave in $LiTaO_3$ or a Love wave in $LiNbO_3$ as a surface acoustic wave.

Thus, in a case where the first filter defines and functions as a filter on the low frequency side and the second filter defines and functions as a filter on the high frequency side, it is possible to make the reflection coefficient of the first filter in the second pass band larger than the reflection coefficient of the third filter in the second pass band. Accordingly, an insertion loss resulting from the first filter or/and the third filter in the total insertion loss in the second pass band of the second filter is able to be decreased. Furthermore, in a case where a Love wave that propagates through a piezoelectric layer composed of $LiNbO_3$ is used as a surface acoustic wave in the third filter, a wide bandwidth is able to be ensured in the third filter.

The first pass band may be on a low frequency side relative to the second pass band. Each of the first filter and the third filter may include one or more elastic wave resonators. Each of the one or more elastic wave resonators included in the first filter and the third filter may be a surface acoustic wave resonator that includes a substrate including a piezoelectric layer and an IDT electrode disposed on the substrate. In the first filter, a leaky wave that propagates through the piezoelectric layer composed of $LiTaO_3$ may be used as a surface acoustic wave. In the third filter, a Love wave that propagates through the piezoelectric layer composed of $LiNbO_3$ may be used as a surface acoustic wave.

In a region on the high frequency side of the resonant point and anti-resonant point of the elastic wave resonator, an unnecessary wave resulting from leakage of a bulk wave is generated. The intensity of the unnecessary wave is able to be decreased more by using a leaky wave in $LiTaO_3$ as a surface acoustic wave than by using a Love wave in $LiNbO_3$ as a surface acoustic wave.

Thus, in a case where the first filter defines and functions as a filter on the low frequency side and the second filter defines and functions as a filter on the high frequency side, it is possible to make the reflection coefficient of the first filter in the second pass band larger than the reflection coefficient of the third filter in the second pass band. Accordingly, an insertion loss resulting from the first filter or/and the third filter in the total insertion loss in the second pass band of the second filter is able to be decreased.

Furthermore, in a case where a Love wave that propagates through a piezoelectric layer composed of $LiNbO_3$ is used as a surface acoustic wave in the third filter, a wide bandwidth is able to be ensured in the third filter.

The first pass band may be on a high frequency side relative to the second pass band. Each of the first filter and the third filter may include one or more elastic wave resonators. In the first filter, (1) a Rayleigh wave that propagates through a piezoelectric layer composed of $LiNbO_3$ may be used as a surface acoustic wave, (2) a leaky wave that propagates through the piezoelectric layer composed of $LiTaO_3$ may be used as a surface acoustic wave, (3) a Love wave that propagates through the piezoelectric layer composed of $LiNbO_3$ may be used as a surface acoustic wave, (4) each of the one or more elastic wave resonators may be an SMR, or (5) each of the one or more elastic wave resonators may be an FBAR. In the third filter, each of the one or more elastic wave resonators may have an acoustic-velocity-film multilayer structure including (i) a piezoelectric layer including main surfaces, an IDT electrode being disposed on one of the main surfaces, (ii) a high-acoustic-velocity supporting substrate through which a bulk wave propagates at an acoustic velocity higher than an acoustic velocity of an elastic wave that propagates through the piezoelectric layer, and (iii) a low-acoustic-velocity film which is disposed between the high-acoustic-velocity supporting substrate and the piezoelectric layer and through which a bulk wave propagates at an acoustic velocity lower than an acoustic velocity of an elastic wave that propagates through the piezoelectric layer.

In a case where the elastic wave resonator has the acoustic-velocity-film multilayer structure, a spurious Rayleigh wave is generated at the vicinity of about 0.76 times the resonant frequency of the elastic wave resonator, for example. Thus, when the third filter has the acoustic-velocity-film multilayer structure and the first filter does not have the acoustic-velocity-film multilayer structure, the reflection coefficient of the first filter in the second pass band is able to be increased while ensuring a low loss and favorable temperature characteristics of the third filter.

Thus, in a case where the first filter defines and functions as a filter on the high frequency side and the second filter defines and functions as a filter on the low frequency side, an insertion loss resulting from the first filter or/and the third filter in the total insertion loss in the second pass band of the second filter is able to be decreased.

The first pass band may be on a high frequency side relative to the second pass band. Each of the first filter and the third filter may include one or more elastic wave resonators. In the first filter, (1) a Rayleigh wave that propagates through a piezoelectric layer composed of $LiNbO_3$ may be used as a surface acoustic wave, (2) a Love wave that propagates through the piezoelectric layer composed of $LiNbO_3$ may be used as a surface acoustic wave, (3) each of the one or more elastic wave resonators may have an acoustic-velocity-film multilayer structure including (i) a piezoelectric layer including main surfaces, an IDT electrode being disposed on one of the main surfaces, (ii) a high-acoustic-velocity supporting substrate through which a bulk wave propagates at an acoustic velocity higher than an acoustic velocity of an elastic wave that propagates through the piezoelectric layer, and (iii) a low-acoustic-velocity film which is disposed between the high-acoustic-velocity supporting substrate and the piezoelectric layer and through which a bulk wave propagates at an acoustic velocity lower than an acoustic velocity of an elastic wave that propagates through the piezoelectric layer, (4) each of the one or more elastic wave resonators may be an SMR, or (5) each of the one or more elastic wave resonators may be an FBAR. In the third filter, a leaky wave that propagates through the piezoelectric layer composed of $LiTaO_3$ may be used as a surface acoustic wave.

In the case of using a leaky wave in $LiTaO_3$ as an elastic wave, a spurious Rayleigh wave is generated at the vicinity of about 0.76 times the resonant frequency of the elastic wave resonator, for example. Thus, when the third filter uses a leaky wave in $LiTaO_3$ as an elastic wave and the first filter does not use a leaky wave in $LiTaO_3$ as an elastic wave, the reflection coefficient of the first filter in the second pass band is able to be effectively increased.

Thus, in a case where the first filter defines and functions as a filter on the high frequency side and the second filter defines and functions as a filter on the low frequency side, an insertion loss resulting from the first filter or/and the third filter in the total insertion loss in the second pass band of the second filter is able to be decreased.

The first pass band may be on a low frequency side relative to the second pass band. Each of the first filter and the third filter may include one or more elastic wave resonators. In the first filter, (1) each of the one or more elastic wave resonators may have an acoustic-velocity-film multilayer structure including (i) a piezoelectric layer including main surfaces, an IDT electrode being disposed on one of the main surfaces, (ii) a high-acoustic-velocity supporting substrate through which a bulk wave propagates at an acoustic velocity higher than an acoustic velocity of an elastic wave that propagates through the piezoelectric layer, and (iii) a low-acoustic-velocity film which is disposed between the high-acoustic-velocity supporting substrate and the piezoelectric layer and through which a bulk wave propagates at an acoustic velocity lower than an acoustic velocity of an elastic wave that propagates through the piezoelectric layer, (2) a leaky wave that propagates through the piezoelectric layer composed of $LiTaO_3$ may be used as a surface acoustic wave, (3) a Love wave that propagates through the piezoelectric layer composed of $LiNbO_3$ may be used as a surface acoustic wave, (4) each of the one or more elastic wave resonators may be an SMR, or (5) each of the one or more elastic wave resonators may be an FBAR. In the third filter, a Rayleigh wave that propagates through the piezoelectric layer composed of $LiNbO_3$ may be used as a surface acoustic wave.

In the case of using a Rayleigh wave in $LiNbO_3$ as an elastic wave, a higher-order mode is generated at the vicinity of about 1.2 times the resonant frequency of the elastic wave resonator, for example. Thus, when the third filter uses a Rayleigh wave in $LiNbO_3$ as an elastic wave and the first filter does not use a Rayleigh wave in $LiNbO_3$ as an elastic wave, the reflection coefficient of the first filter in the second pass band can be effectively increased.

Thus, in a case where the first filter defines and functions as a filter on the low frequency side and the second filter defines and functions as a filter on the high frequency side, an insertion loss resulting from the first filter or/and the third filter in the total insertion loss in the second pass band of the second filter is able to be decreased.

The first pass band may be on a low frequency side relative to the second pass band. Each of the first filter and the third filter may include one or more elastic wave resonators. In the first filter, (1) a Rayleigh wave that propagates through a piezoelectric layer composed of $LiNbO_3$ may be used as a surface acoustic wave, (2) each of the one or more elastic wave resonators may have an acoustic-velocity-film multilayer structure including (i) a piezoelectric layer including main surfaces, an IDT electrode being disposed on one of the main surfaces, (ii) a high-acoustic-velocity supporting substrate through which a bulk wave propagates at an acoustic velocity higher than an acoustic velocity of an elastic wave that propagates through the piezoelectric layer, and (iii) a low-acoustic-velocity film which is disposed between the high-acoustic-velocity supporting substrate and the piezoelectric layer and through which a bulk wave propagates at an acoustic velocity lower than an acoustic velocity of an elastic wave that propagates through the piezoelectric layer, (3) a leaky wave that propagates through the piezoelectric layer composed of $LiTaO_3$ may be used as a surface acoustic wave, (4) each of the one or more elastic wave resonators may be an SMR, or (5) each of the one or more elastic wave resonators may be an FBAR. In the third filter, a Love wave that propagates through the piezoelectric layer composed of $LiNbO_3$ may be used as a surface acoustic wave.

In the case of using a Love wave in $LiNbO_3$ as an elastic wave, a higher-order mode is generated at the vicinity of about 1.2 times the resonant frequency of the elastic wave resonator, for example. Thus, when the third filter uses a Love wave in $LiNbO_3$ as an elastic wave and the first filter does not use a Love wave in $LiNbO_3$ as an elastic wave, the reflection coefficient of the first filter in the second pass band is able to be effectively increased.

Thus, in a case where the first filter defines and functions as a filter on the low frequency side and the second filter defines and functions as a filter on the high frequency side, an insertion loss resulting from the first filter or/and the third filter in the total insertion loss in the second pass band of the second filter is able to be decreased.

Each of the two or more elastic wave resonators included in the first filter and the third filter may be a surface acoustic wave resonator that includes a substrate including a piezoelectric layer and an IDT electrode disposed on the substrate. In the first filter and the third filter, a leaky wave that propagates through the piezoelectric layer composed of $LiTaO_3$ may be used as a surface acoustic wave. A film thickness or a duty ratio may be different between the IDT electrode included in the first filter and the IDT electrode included in the third filter.

In the case of using a leaky wave in $LiTaO_3$ as an elastic wave, a spurious Rayleigh wave is generated on the low frequency side of the resonant frequency of the elastic wave resonator. If the film thickness or duty ratio of the IDT electrode is different between the first filter and the third filter, the frequency at which a spurious Rayleigh wave is generated in the first filter is able to be shifted to the outside of the second pass band. Accordingly, the reflection coefficient of the first filter in the second pass band is able to be effectively increased, and an insertion loss resulting from the first filter or/and the third filter in the total insertion loss in the second pass band of the second filter is able to be decreased.

Each of the two or more elastic wave resonators included in the first filter and the third filter may be a surface acoustic wave resonator that includes a substrate including a piezoelectric layer and an IDT electrode disposed on the substrate. In the first filter and the third filter, each of the two or more elastic wave resonators may have an acoustic-velocity-film multilayer structure including (i) the piezoelectric layer including main surfaces, the IDT electrode being disposed on one of the main surfaces, (ii) a high-acoustic-velocity supporting substrate through which a bulk wave propagates at an acoustic velocity higher than an acoustic velocity of an elastic wave that propagates through the piezoelectric layer, and (iii) a low-acoustic-velocity film which is disposed between the high-acoustic-velocity supporting substrate and the piezoelectric layer and through which a bulk wave propagates at an acoustic velocity lower than an acoustic velocity of an elastic wave that propagates through the piezoelectric layer. Any one of a film thickness of the IDT electrode, a duty ratio of the IDT electrode, and a film thickness of the low-acoustic-velocity film may be different between the first filter and the third filter.

In the case of adopting the acoustic-velocity-film multilayer structure, a spurious Rayleigh wave is generated on the low frequency side of the resonant frequency of the elastic wave resonator. If the film thickness or duty ratio of the IDT electrode is different between the first filter and the third filter, the frequency at which a spurious Rayleigh wave is generated in the first filter is able to be shifted to the outside of the second pass band. Accordingly, the reflection coefficient of the first filter in the second pass band is able to be effectively increased, and an insertion loss resulting from the first filter or/and the third filter in the total insertion loss in the second pass band of the second filter is able to be decreased.

Each of the two or more elastic wave resonators included in the first filter and the third filter may be a surface acoustic wave resonator that includes a substrate including a piezoelectric layer, an IDT electrode disposed on the substrate, and a protective film disposed on the IDT electrode. In the first filter and the third filter, (1) a Rayleigh wave that propagates through the piezoelectric layer composed of $LiNbO_3$ or (2) a Love wave that propagates through the piezoelectric layer composed of $LiNbO_3$ may be used as a surface acoustic wave. Any one of a film thickness of the IDT electrode, a duty ratio of the IDT electrode, and a film thickness of the protective film may be different between the first filter and the third filter.

In the case of using a Rayleigh wave in $LiNbO_3$ or a Love wave in $LiNbO_3$ as a surface acoustic wave, a higher-order mode is generated on the high frequency side of the resonant frequency of the elastic wave resonator. If the film thickness of the IDT electrode, the duty ratio of the IDT electrode, or the film thickness of the protective film is different between the first filter and the third filter, the frequency at which a higher-order mode is generated in the first filter is able to be shifted to the outside of the second pass band. Accordingly, the reflection coefficient of the first filter in the second pass band is able to be effectively increased, and an insertion loss resulting from the first filter or/and the third filter in the total insertion loss in the second pass band of the second filter is able to be decreased.

Each of the two or more elastic wave resonators included in the first filter and the third filter may be a surface acoustic wave resonator that includes a substrate including a piezoelectric layer and an IDT electrode disposed on the substrate. In the first filter and the third filter, each of the two or more elastic wave resonators may have an acoustic-velocity-film multilayer structure including (i) the piezoelectric layer including main surfaces, the IDT electrode being disposed on one of the main surfaces, (ii) a high-acoustic-velocity supporting substrate through which a bulk wave propagates at an acoustic velocity higher than an acoustic velocity of an elastic wave that propagates through the piezoelectric layer, and (iii) a low-acoustic-velocity film which is disposed between the high-acoustic-velocity supporting substrate and the piezoelectric layer and through which a bulk wave propagates at an acoustic velocity lower than an acoustic velocity of an elastic wave that propagates through the piezoelectric layer. The high-acoustic-velocity supporting substrate may be composed of a silicon crystal. Any one of a film thickness of the piezoelectric layer, a film thickness of the low-acoustic-velocity film, and a silicon crystal orientation of the high-acoustic-velocity supporting substrate may be different between the first filter and the third filter.

In the case of adopting the acoustic-velocity-film multilayer structure, a higher-order mode is generated on the high frequency side of the resonant frequency of the elastic wave resonator. If the film thickness of the piezoelectric layer, the film thickness of the low-acoustic-velocity film, or the silicon crystal orientation of the high-acoustic-velocity supporting substrate is different between the first filter and the third filter, the frequency at which a higher-order mode is generated in the first filter is able to be shifted to the outside of the second pass band. Accordingly, the reflection coefficient of the first filter in the second pass band is able to be effectively increased, and an insertion loss resulting from the first filter or/and the third filter in the total insertion loss in the second pass band of the second filter is able to be decreased.

Each of the two or more elastic wave resonators included in the first filter and the third filter may be a surface acoustic wave resonator that includes a substrate including a piezoelectric layer and an IDT electrode disposed on the substrate. In the first filter and the third filter, (1) a leaky wave that propagates through the piezoelectric layer composed of $LiTaO_3$ or (2) a Love wave that propagates through the piezoelectric layer composed of $LiNbO_3$ may be used as a surface acoustic wave. A film thickness of the IDT electrode may be different between the first filter and the third filter.

In the case of using a leaky wave in $LiTaO_3$ or a Love wave in $LiNbO_3$ as a surface acoustic wave, a bulk wave (unnecessary wave) is generated on the high frequency side of the resonant frequency of the elastic wave resonator. If the film thickness of the IDT electrode is different between the first filter and the third filter, the frequency at which a bulk wave is generated in the first filter is able to be shifted to the outside of the second pass band. Accordingly, the reflection coefficient of the first filter in the second pass band is effectively increased, and an insertion loss resulting from the first filter or/and the third filter in the total insertion loss in the second pass band of the second filter is decreased.

The RF front-end circuit may further include a first amplifying circuit connected to the first input/output terminal; and a second amplifying circuit connected to the second input/output terminal.

Accordingly, in the RF front-end circuit including the amplifying circuit, an insertion loss resulting from the first filter or/and the third filter in the total insertion loss in the second pass band of the second filter is decreased.

According to preferred embodiments of the present invention, communication devices include an RF signal processing circuit that processes an RF signal transmitted or received by an antenna element; and the above-described RF front-end circuit that transmits or receives the RF signal to or from the antenna element or the RF signal processing circuit.

Accordingly, compact communication devices in which an insertion loss resulting from the first filter or/and the third filter in the total insertion loss in the second pass band of the second filter is decreased are able to be provided.

According to other preferred embodiments of the present invention, compact RF front-end circuits or communication devices in which propagation loss of an RF signal is decreased even during a CA operation are able to be provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is a diagram for describing an issue in a case where two filters are connected in common to a common terminal.

FIG. 8A is a diagram for describing leakage of a bulk wave in a high band of an RF front-end circuit according to a first modification example of the second preferred embodiment of the present invention.

FIG. 8B is a diagram illustrating combinations of configurations of the first filter and the third filter according to the first modification example of the second preferred embodiment of the present invention.

FIG. 11A is a graph illustrating an increase in return loss caused by a higher-order mode in the first filter according to the second preferred embodiment of the present invention.

FIG. 11B is a diagram illustrating parameters for varying the structures of the first filter and the third filter according to a fourth modification example of the second preferred embodiment of the present invention.

FIG. 11C is a diagram illustrating parameters for varying the structures of the first filter and the third filter according to a fifth modification example of the second preferred embodiment of the present invention.

FIG. 12 is a diagram illustrating parameters for varying the structures of the first filter and the third filter according to a sixth modification example of the second preferred embodiment of the present invention.

FIG. 13A is a circuit configuration diagram of an RF front-end circuit according to a third preferred embodiment of the present invention.

FIG. 13B is a circuit configuration diagram of an RF front-end circuit according to a comparative example.

DETAILED DESCRIPTION OF THE PREFERRED EMBODIMENTS

Figure 1A:
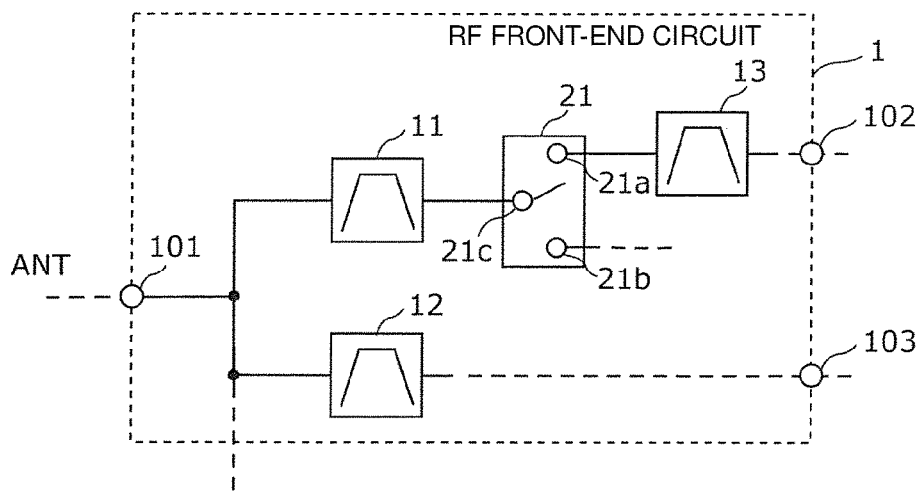
FIG. 1A is a circuit configuration diagram of an RF front-end circuit according to a first preferred embodiment of the present invention.

Hereinafter, preferred embodiments of the present invention will be described in detail with reference to the attached drawings. The preferred embodiments described below are general or specific examples. The values, shapes, materials, elements, and locations and connection configurations of the elements described in the preferred embodiments are merely examples and do not limit the scope of the present invention. Among the elements according to the following preferred embodiments, an element that is not described in an independent claim will be described as an optional element. Note that the sizes or size ratios of the elements illustrated in the drawings are not necessarily strict.

First Preferred Embodiment

FIG. 1A is a circuit configuration diagram of a radio-frequency (RF) front-end circuit 1 according to a first preferred embodiment of the present invention. As illustrated in FIG. 1A, the RF front-end circuit 1 includes a first filter 11, a second filter 12, a third filter 13, a switch 21, an antenna common terminal 101, an input/output terminal 102, and an input/output terminal 103. The RF front-end circuit 1 is a composite elastic wave filter device including the first filter 11 and the second filter 12 that are connected in common to the antenna common terminal 101.

The antenna common terminal 101 can be connected to an antenna element, for example. The input/output terminals 102 and 103 can be connected to an RF signal processing circuit via an amplifying circuit.

The first filter 11 is a filter that includes a first terminal and a second terminal and has a first pass band. The first terminal is connected to the antenna common terminal 101.

The second filter 12 is a filter that is connected to the antenna common terminal 101, is disposed between the antenna common terminal 101 and the input/output terminal 103, and has a second pass band different from the first pass band.

The first filter 11 and the second filter 12 define a demultiplexing/multiplexing circuit.

The switch 21 is a switch circuit that includes a common terminal 21c, a selection terminal 21a (first selection terminal), and a selection terminal 21b (second selection terminal). The common terminal 21c is connected to the second terminal of the first filter 11.

The third filter 13 is a filter that is connected to the selection terminal 21a and is disposed between the switch 21 and the input/output terminal 102.

The selection terminal 21b of the switch 21 may be connected to a filter having a pass band different from the pass band of the third filter 13 or may be directly connected to the amplifying circuit. The number of selection terminals of the switch 21 may be three or more, for example. The pass band of the filter connected to the selection terminal 21b may overlap the pass band of the third filter 13. Also in this case, the switch 21 enables an RF signal that passes through the first filter 11 to propagate along a single path via the selection terminal 21a or 21b.

The circuit configuration of a subsequent stage of the second filter 12 (the stage opposite the antenna common terminal 101 across the second filter 12) may be the same as the circuit configuration of a subsequent stage of the first filter 11. Alternatively, the second filter 12 may be directly connected to the amplifying circuit with no switch being provided.

Figure 1B:
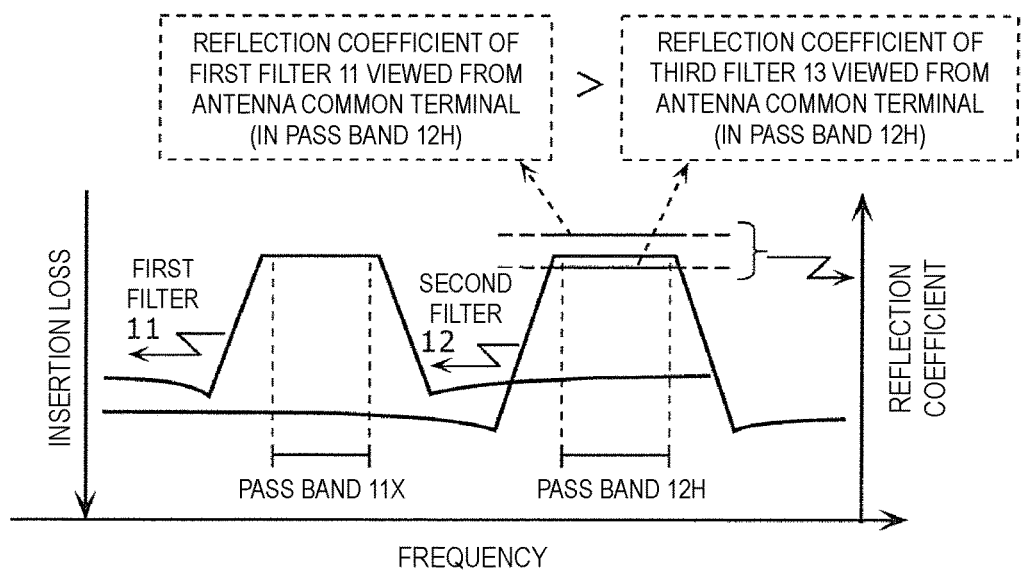
FIG. 1B is a diagram for describing reflection characteristics of the RF front-end circuit according to the first preferred embodiment of the present invention.

FIG. 1B is a diagram for describing the reflection characteristics of the RF front-end circuit 1 according to the first preferred embodiment. FIG. 1B illustrates the bandpass characteristics of the first filter 11 and the second filter 12 that are connected in common to the antenna common terminal 101, and the reflection characteristics of the first filter 11 and the third filter 13. In the RF front-end circuit 1 according to the first preferred embodiment, a reflection coefficient of the first filter 11 alone in a pass band 12H (second pass band) viewed from the antenna common terminal 101 is larger than a reflection coefficient of the third filter 13 alone in the pass band 12H (second pass band) viewed from the antenna common terminal 101.

The frequency relationship between the first filter 11 and the second filter 12 is not limited to a relationship in which the first filter 11 is on a low frequency side and the second filter 12 is on a high frequency side as illustrated in FIG. 1B, but may be a relationship in which the first filter 11 is on a high frequency side and the second filter 12 is on a low frequency side.

FIG. 2 is a diagram for describing an issue in a case where two filters (filter A and filter B) are connected in common to an antenna common terminal. Referring to FIG. 2, a demultiplexing circuit is assumed in which filter A (pass band A) and filter B (pass band B) are connected in common to an antenna common terminal. The insertion loss of the demultiplexing circuit in this case will be discussed.

The insertion loss of filter A in pass band A is increased by an influence of filter B. In the total insertion loss of filter A, an insertion loss resulting from filter B is affected by the reflection characteristics of filter B in pass band A. More specifically, in the total insertion loss of filter A, an insertion loss resulting from filter B decreases as the reflection coefficient of filter B viewed from the antenna common terminal before filter B is connected in common to the antenna common terminal increases.

In the case of applying, to the RF front-end circuit 1 according to the first preferred embodiment, the foregoing configuration to decrease an insertion loss resulting from the other filter connected in common, it is necessary to increase the reflection coefficient of an RF signal in the second pass band that is to propagate from the antenna common terminal 101 to the input/output terminal 102 in order to allow an RF signal in the second pass band propagating from the antenna common terminal 101 to the input/output terminal 103 to pass while suppressing an insertion loss resulting from the other filter connected in common. In other words, in order to decrease an insertion loss resulting from the first filter 11 or/and the third filter 13 in the total insertion loss of the second filter 12 in the second pass band, it is necessary to increase the reflection coefficient of the series-connected first filter 11 and third filter 13 in the second pass band viewed from the antenna common terminal 101.

Furthermore, in a case where a plurality of filters are connected in series, a filter near the antenna common terminal among the series-connected filters contributes more to the reflection coefficient viewed from the antenna common terminal. In other words, in order to decrease an insertion loss resulting from the other filter connected in common in the total insertion loss of the second filter 12, it is effective to increase the reflection coefficient of the first filter 11, which is near the antenna common terminal 101 among the series-connected first filter 11 and third filter 13, in the second pass band.

On the other hand, it is necessary to ensure the filter characteristics, including bandpass characteristics, attenuation characteristics, temperature characteristics, and bandwidths, of the series-connected first filter 11 and third filter 13 in accordance with required specifications, while improving the reflection characteristics of the series-connected first filter 11 and third filter 13 in the manner described above. The reflection characteristics and the filter characteristics may be incompatible with each other depending on filter configurations.

From the above-described point of view, the inventors have conceived of a configuration of, in the series-connected first filter 11 and third filter 13, preferentially increasing a reflection coefficient of the first filter 11 having a greater influence on reflection characteristics, and ensuring filter characteristics, including bandpass characteristics, attenuation characteristics, temperature characteristics, and a bandwidth, of the third filter 13 having a smaller influence on reflection characteristics.

In the configuration of the RF front-end circuit 1 according to the first preferred embodiment, the reflection coefficient of the first filter 11 in the second pass band is larger than the reflection coefficient of the third filter 13 in the second pass band. In the third filter 13 in a subsequent stage of the first filter 11, bandpass characteristics and attenuation characteristics of the filter take precedence over reflection characteristics. Thus, the reflection coefficient of the first filter 11, switch 21, and third filter 13 in the second pass band viewed from the antenna common terminal 101 is able to be effectively increased without degrading the filter characteristics of the third filter 13. Accordingly, an insertion loss resulting from the first filter 11 or/and the third filter 13 in the total insertion loss of the second filter 12 in the second pass band is able to be effectively decreased without disposing a switch between the antenna element and the demultiplexing/multiplexing circuit formed of the first filter 11 and the second filter 12, and thus the RF front-end circuit 1 that is compact and capable of maintaining low-loss signal propagation characteristics even during a CA operation is able to be provided.

Preferably, the reflection coefficient of the first filter 11 in the second pass band is about 0.9 or more, for example.

In the RF front-end circuit 1 according to the first preferred embodiment, the filters connected in common to the antenna common terminal 101 are not limited to the first filter 11 and the second filter 12, and three or more filters may be connected in common to the antenna common terminal 101.

Figure 3A:
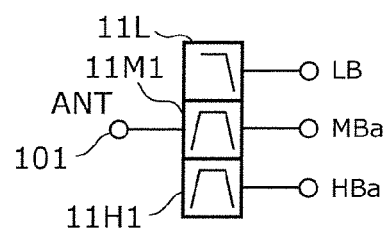
FIG. 3A is a circuit configuration diagram of a demultiplexing circuit according to a first modification example of the first preferred embodiment of the present invention.

FIG. 3A is a circuit configuration diagram of a demultiplexing circuit according to a first modification example of the first preferred embodiment. FIG. 3A illustrates an example circuit configuration of a triplexer that is applied to the demultiplexing/multiplexing circuit of the RF front-end circuit according to the first preferred embodiment.

An RF front-end circuit according to the first modification example includes a low band (LB: about 698-960 MHz) filter 11L, a middle band (MBa: about 1710-2200 MHz) filter 11M1, and a high band (HBa: about 2300-2690 MHz) filter 11H1 that are connected to the antenna common terminal 101 and define and function as a demultiplexing/multiplexing circuit, for example.

That is, the RF front-end circuit according to the first modification example includes a fourth filter connected to the antenna common terminal 101 and having a third pass band, in addition to the first filter 11 and the second filter 12. Here, the first filter 11 according to the first preferred embodiment corresponds to any one of the LB filter 11L, the MBa filter 11M1, and the HBa filter 11H1 according to the first modification example.

Figure 3B:
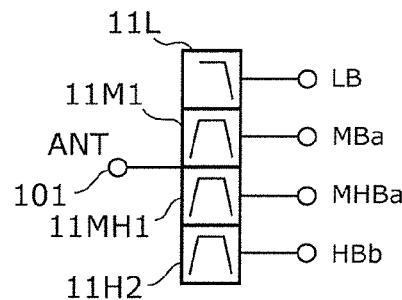
FIG. 3B is a circuit configuration diagram of a demultiplexing circuit according to a second modification example of the first preferred embodiment of the present invention.

FIG. 3B is a circuit configuration diagram of a demultiplexing circuit according to a second modification example of the first preferred embodiment. FIG. 3B illustrates an example circuit configuration of a quadplexer that is applied to the demultiplexing/multiplexing circuit of the RF front-end circuit according to the first preferred embodiment.

An RF front-end circuit according to the second modification example includes the low band (LB: about 698-960 MHz) filter 11L, the middle band (MBa: about 1710-2200 MHz) filter 11M1, a middle high band (MHBa: about 2300-2400 MHz) filter 11MH1, and a high band (HBb: about 2496-2690 MHz) filter 11H2 that are connected to the antenna common terminal 101 and define and function as a demultiplexing/multiplexing circuit, for example.

That is, the RF front-end circuit according to the second modification example includes a fourth filter connected to the antenna common terminal 101 and having a third pass band and a fifth filter having a fourth pass band, in addition to the first filter 11 and the second filter 12. Here, the first filter 11 according to the first preferred embodiment corresponds to any one of the LB filter 11L, the MBa filter 11M1, the MHBa filter 11MH1, and the HBb filter 11H2 according to the second modification example.

Figure 3C:
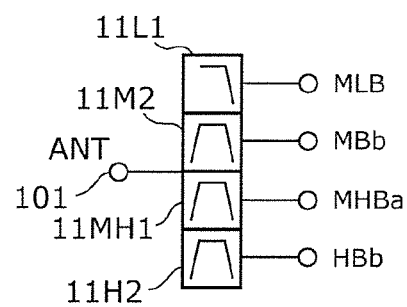
FIG. 3C is a circuit configuration diagram of a demultiplexing circuit according to a third modification example of the first preferred embodiment of the present invention.

FIG. 3C is a circuit configuration diagram of a demultiplexing circuit according to a third modification example of the first preferred embodiment. FIG. 3C illustrates an example circuit configuration of a quadplexer that is applied to the demultiplexing/multiplexing circuit of the RF front-end circuit according to the first preferred embodiment.

An RF front-end circuit according to the third modification example includes a middle low band (MLB: about 1475.9-2025 MHz) filter 11L1, a middle band (MBb: about 2110-2200 MHz) filter 11M2, the middle high band (MHBa: about 2300-2400 MHz or about 2300-2370 MHz) filter 11MH1, and the high band (HBb: about 2496-2690 MHz)

filter 11H2 that are connected to the antenna common terminal 101 and define and function as a demultiplexing/multiplexing circuit, for example.

That is, the RF front-end circuit according to the third modification example includes a fourth filter connected to the antenna common terminal 101 and having a third pass band and a fifth filter having a fourth pass band, in addition to the first filter 11 and the second filter 12. Here, the first filter 11 according to the first preferred embodiment corresponds to any one of the MLB filter 11L1, the MBb filter 11M2, the MHBa filter 11MH1, and the HBb filter 11H2 according to the third modification example.

Figure 4:
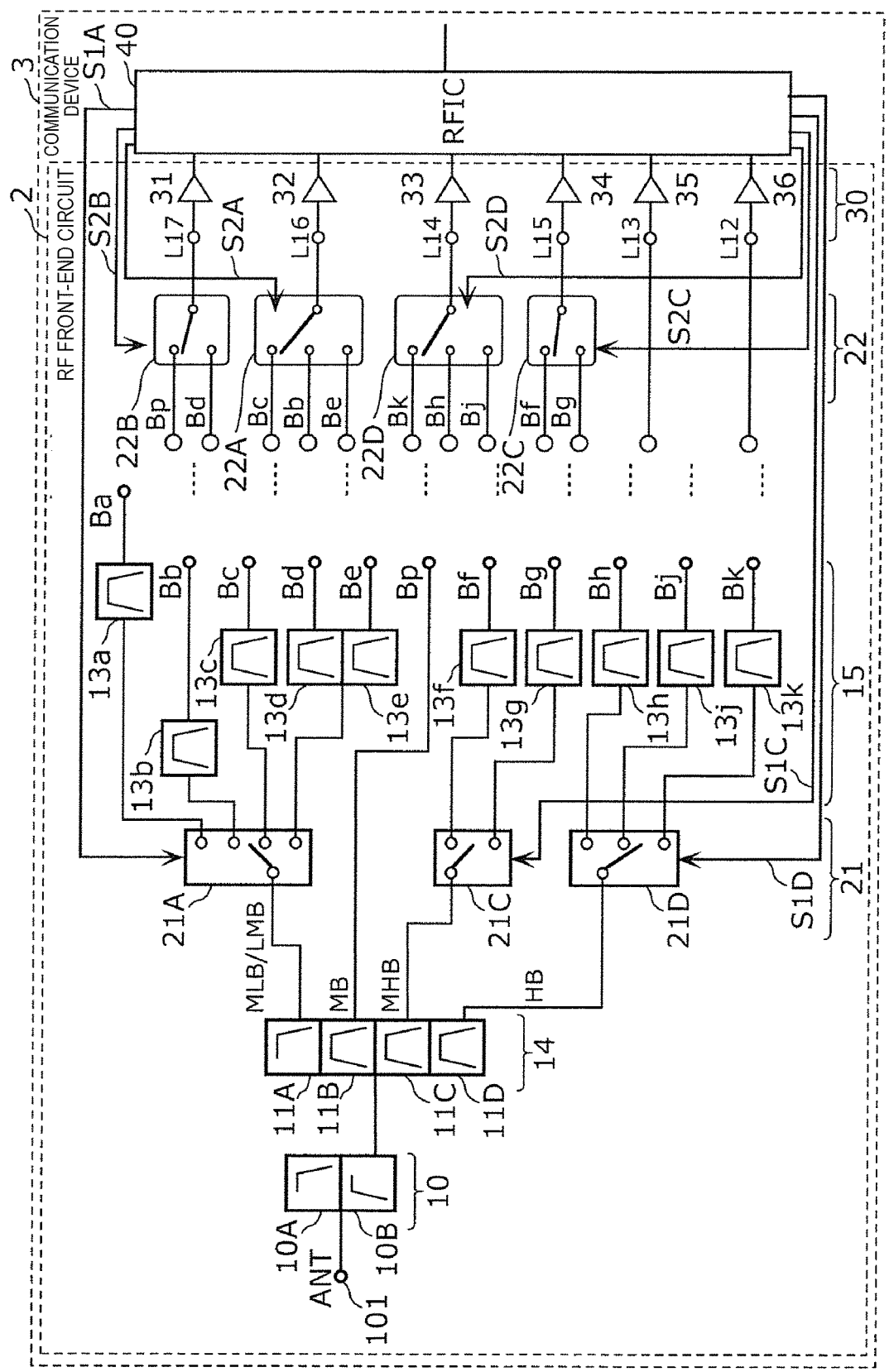
FIG. 4 is a circuit configuration diagram of a communication device according to a fourth modification example of the first preferred embodiment of the present invention.

FIG. 4 is a circuit configuration diagram of a communication device 3 according to a fourth modification example of the first preferred embodiment. FIG. 4 illustrates the communication device 3 according to the first preferred embodiment. The communication device 3 includes an RF front-end circuit 2 according to the fourth modification example and an RF signal processing circuit (RFIC) 40.

The RF front-end circuit 2 includes the antenna common terminal 101, demultiplexing circuits 10 and 14, switches 21 and 22, a filter circuit 15, and an amplifying circuit 30.

The demultiplexing circuit 10 is connected to the antenna common terminal 101 and includes a low pass filter 10A (pass band: about 699-960 MHz) and a high pass filter 10B (pass band: about 1475.9-2690 MHz), for example.

The demultiplexing circuit 14 is connected to the high pass filter 10B and includes an MLB filter 11A (about 1475.9-2025 MHz), an MBb filter 11B (about 2110-2200 MHz), an MHBa filter 11C (about 2300-2400 MHz or about 2300-2370 MHz), and an HBb filter 11D (about 2496-2690 MHz), for example.

The switch 21 includes switches 21A, 21C, and 21D. The switch 22 includes switches 22A, 22B, 22C, and 22D.

The filter circuit 15 includes filters 13a, 13b, 13c, 13d, 13e, 13f, 13g, 13h, 13j, and 13k.

The amplifying circuit 30 includes low noise amplifiers (LNAs) 31, 32, 33, 34, 35, and 36.

The demultiplexing circuit 14 divides the frequency band of an RF signal into four frequency band groups. More specifically, the MLB filter 11A allows signals in Band a (Ba), Band b (Bb), Band c (Bc), Band d (Bd), and Band e (Be) to pass therethrough, the MBb filter 11B allows a signal in Band p (Bp) to pass therethrough, the MHBa filter 11C allows signals in Band f (Bf) and Band g (Bg) to pass therethrough, and the HBb filter 11D allows signals in Band h (Bh), Band j (Bj), and Band k (Bk) to pass therethrough.

The switch 21A includes a common terminal connected to the MLB filter 11A, and selection terminals respectively connected to the filters 13a (Ba), 13b (Bb), 13c (Bc), and 13d/13e (Bd/Be).

The switch 21C includes a common terminal connected to the MHBa filter 11C, and selection terminals respectively connected to the filters 13f (Bf) and 13g (Bg).

The switch 21D includes a common terminal connected to the HBb filter 11D, and selection terminals respectively connected to the filters 13h (Bh), 13j (Bj), and 13k (Bk).

The switch 22B includes a common terminal connected to the LNA 31, and selection terminals respectively connected to the MBb filter 11B and the filter 13d.

The switch 22A includes a common terminal connected to the LNA 32, and selection terminals respectively connected to the filters 13c, 13b, and 13e.

The switch 22D includes a common terminal connected to the LNA 33, and selection terminals respectively connected to the filters 13k, 13h, and 13j.

The switch 22C includes a common terminal connected to the LNA 34, and selection terminals respectively connected to the filters 13f and 13g.

The pass band of the MLB filter 11A (about 1475.9-2025 MHz) is wider than the pass band of each of the filters 13a (Ba), 13b (Bb), 13c (Bc), and 13d/13e (Bd/Be) and includes these individual pass bands. The pass band of the MBb filter 11B (about 2110-2200 MHz) includes the pass band of Bp. The pass band of the MHBa filter 11C (about 2300-2400 MHz or about 2300-2370 MHz) is wider than the pass band of each of the filters 13f (Bf) and 13g (Bg) and includes these individual pass bands. The pass band of the HBb filter 11D (about 2496-2690 MHz) is wider than the pass band of each of the filters 13h (Bh), 13j (Bj), and 13k (Bk) and includes these individual pass bands.

The RF signal processing circuit (RFIC) 40 is connected to output terminals of the LNAs 31 to 36, performs signal processing such as down converting on RF reception signals input from the antenna element through reception signal paths of individual bands, and outputs the reception signals generated by the signal processing to a baseband signal processing circuit in a subsequent stage. The RF signal processing circuit 40 is an RFIC, for example. The RF signal processing circuit (RFIC) 40 outputs control signals S1A, S1C, S1D, S2A, S2B, S2C, and S2D to the switches 21A, 21C, 21D, 22A, 22B, 22C, and 22D, respectively in accordance with the bands to be used. Accordingly, the individual switches switch the connections of signal paths.

In the communication device 3 having the above-described configuration, a CA operation can be performed by selecting one band from each of MLB (about 1475.9-2025 MHz), MBb (about 2110-2200 MHz), MHBa (about 2300-2400 MHz or about 2300-2370 MHz), and HBb (about 2496-2690 MHz) by switching the switches 21A, 21C, and 21D, for example.

The configuration of the RF front-end circuit 1 according to the first preferred embodiment is applicable to the RF front-end circuit 2 according to the fourth modification example. That is, a combination of the first filter 11 and the third filter 13 of the RF front-end circuit 1 may be any one of (1) MLB filter 11A and filter 13a (Ba), (2) MLB filter 11A and filter 13b (Bb), (3) MLB filter 11A and filter 13c (Bc), (4) MLB filter 11A and filter 13d/13e (Bd/Be), (5) MHBa filter 11C and filter 13f (Bf), (6) MHBa filter 11C and filter 13g (Bg), (7) HBb filter 11D and filter 13h (Bh), (8) HBb filter 11D and filter 13j (Bj), and (9) HBb filter 11D and filter 13k (Bk). The second filter 12 may be at least one of the MLB filter 11A, MBb filter 11B, MHBa filter 11C, and HBb filter 11D.

For example, in a case where (1) MLB filter 11A and filter 13a (Ba) is selected as a combination of the first filter 11 and the third filter 13 and in a case where the MBb filter 11B is selected as the second filter 12, the reflection coefficient of the MLB filter 11A in about 2110-2200 MHz (the pass band of the MBb filter 11B) is set to be larger than the reflection coefficient of the filter 13a in about 2110-2200 MHz (the pass band of the MBb filter 11B), for example.

For example, in a case where (1) MLB filter 11A and filter 13a (Ba) is selected as a combination of the first filter 11 and the third filter 13 and in a case where the MBb filter 11B, MHBa filter 11C, and HBb filter 11D are selected as the second filter 12, the reflection coefficient of the MLB filter 11A in about 2110-2200 MHz (the pass band of the MBb filter 11B), about 2300-2400 MHz or about 2300-2370 MHz (the pass band of the MHBa filter 11C), and about 2496-2690 MHz (the pass band of the HBb filter 11D) is set to be larger than the reflection coefficient of the filter 13a in about 2110-2200 MHz, about 2300-2400 MHz or about 2300-2370 MHz, and about 2496-2690 MHz, for example.

With the above-described configuration, even if the number of bands where a CA operation is performed is increased, all CA combinations defined by, for example, the 3GPP standard, can be used by setting the relationship in reflection characteristics between the demultiplexing circuit 14 and the filter circuit 15 to the relationship in reflection characteristics between the first filter 11 and the third filter 13 according to the first preferred embodiment. By setting the relationship in reflection characteristics between the demultiplexing circuit 14 and the filter circuit 15, it becomes possible to easily change the bands corresponding to the filter circuit 15 in a subsequent stage. As a result, a module having an optimum band configuration with simplified circuit design can be provided for each destination.

In the fourth modification example, a description has been given of an RF front-end circuit for reception that receives an RF signal from the antenna element and transmits the RF signal to the RF signal processing circuit 40, but this modification may be applied to an RF front-end circuit for transmission or for transmission and reception. In the case of an RF front-end circuit for transmission, the amplifying circuit 30 is formed of a power amplifier. In the case of an RF front-end circuit for transmission and reception, the filter circuit 15 is formed of a duplexer assigned to individual bands.

Figure 5A:
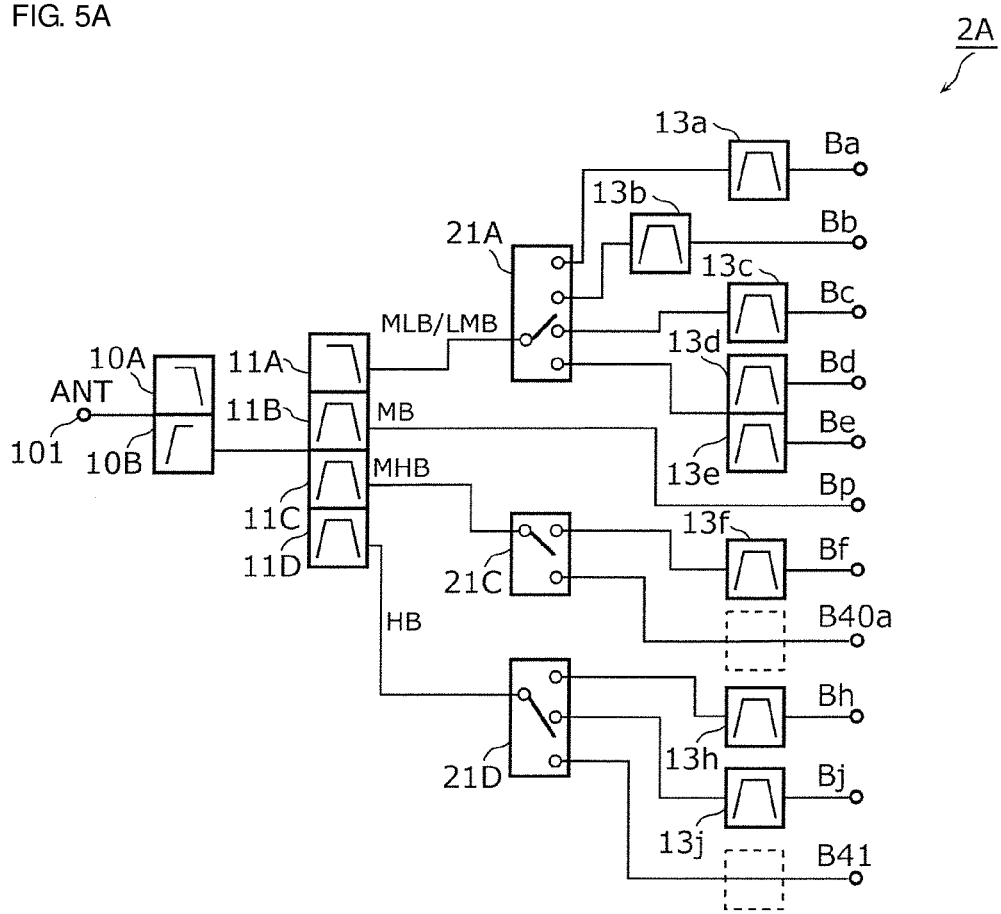
FIG. 5A is a circuit configuration diagram of an RF front-end circuit according to a fifth modification example of the first preferred embodiment of the present invention.

FIG. 5A is a circuit configuration diagram of an RF front-end circuit 2A according to a fifth modification example of the first preferred embodiment. The RF front-end circuit 2A according to the fifth modification example is different from the RF front-end circuit 2 according to the fourth modification example in that the filters 13g and 13k are not included. Hereinafter, the RF front-end circuit 2A according to the fifth modification example will be described. The description will be given mainly of a difference from the RF front-end circuit 2 according to the fourth modification example, and the description of the same point will be omitted.

In the RF front-end circuit 2A, in a case where the pass band of the MHBa filter 11C is about 2300-2370 MHz, the pass band matches the pass band of Band 40a (B40a) (corresponding to Bg, pass band: 2300-2370 MHz) in a subsequent stage of the MHBa filter 11C, for example. On the other hand, the filter 13f in a subsequent stage of the MHBa filter 11C corresponds to Band 30 (B30) (pass band: 2350-2360 MHz), for example, and the pass band is included in the pass band of about 2300-2370 MHz of the MHBa filter 11C. Here, the bandpass characteristics of the MHBa filter 11C are sufficient for the bandpass characteristics of a signal in B40a, and thus it is not necessary to dispose the filter 13g on the signal path of B40a. Thus, with the configuration including the demultiplexing circuit 14 (quadplexer) supporting MLB, MBb, MHBa, and HBb, a more compact RF front-end circuit having low-loss signal propagation characteristics even during a CA operation is able to be obtained.

In the RF front-end circuit 2A, in a case where the pass band of the MHBa filter 11C is about 2300-2400 MHz, the pass band matches the pass band of Band 40 (B40) (corresponding to Bg, pass band: 2300-2400 MHz) in a subsequent stage of the MHBa filter 11C, for example. On the other hand, the filter 13f in a subsequent stage of the MHBa filter 11C corresponds to Band 30 (B30) (pass band: 2350-2360 MHz), for example, and the pass band is included in the pass band of about 2300-2400 MHz of the MHBa filter 11C. Here, the bandpass characteristics of the MHBa filter 11C are sufficient for the bandpass characteristics of a signal in B40, and thus it is not necessary to dispose the filter 13g on the signal path of B40. Thus, in the configuration including the demultiplexing circuit 14 (quadplexer) supporting MLB, MBb, MHBa, and HBb, a more compact RF front-end circuit having low-loss signal propagation characteristics even during a CA operation is able to be obtained.

In the RF front-end circuit 2A, the pass band of the HBb filter 11D preferably is about 2496-2690 MHz, which matches the pass band of Band 41 (B41) in a subsequent stage of the HBb filter 11D. On the other hand, the filter 13h in a subsequent stage of the HBb filter 11D corresponds to Band 38 (B38) (pass band: 2570-2620 MHz), for example, and the pass band is included in the pass band of about 2496-2690 MHz of the HBb filter 11D. The filter 13j in a subsequent stage of the HBb filter 11D corresponds to Band 7 (B7) (pass band: 2620-2690 MHz), for example, and the pass band is included in the pass band of about 2496-2690 MHz of the HBb filter 11D. Here, the bandpass characteristics of the HBb filter 11D are sufficient for the bandpass characteristics of a signal in B41, and thus it is not necessary to dispose the filter 13k on the signal path of B41. Thus, in the configuration including the demultiplexing circuit 14 (quadplexer) supporting MLB, MBb, MHBa, and HBb, a more compact RF front-end circuit having low-loss signal propagation characteristics even during a CA operation is able to be obtained.

Figure 5B:
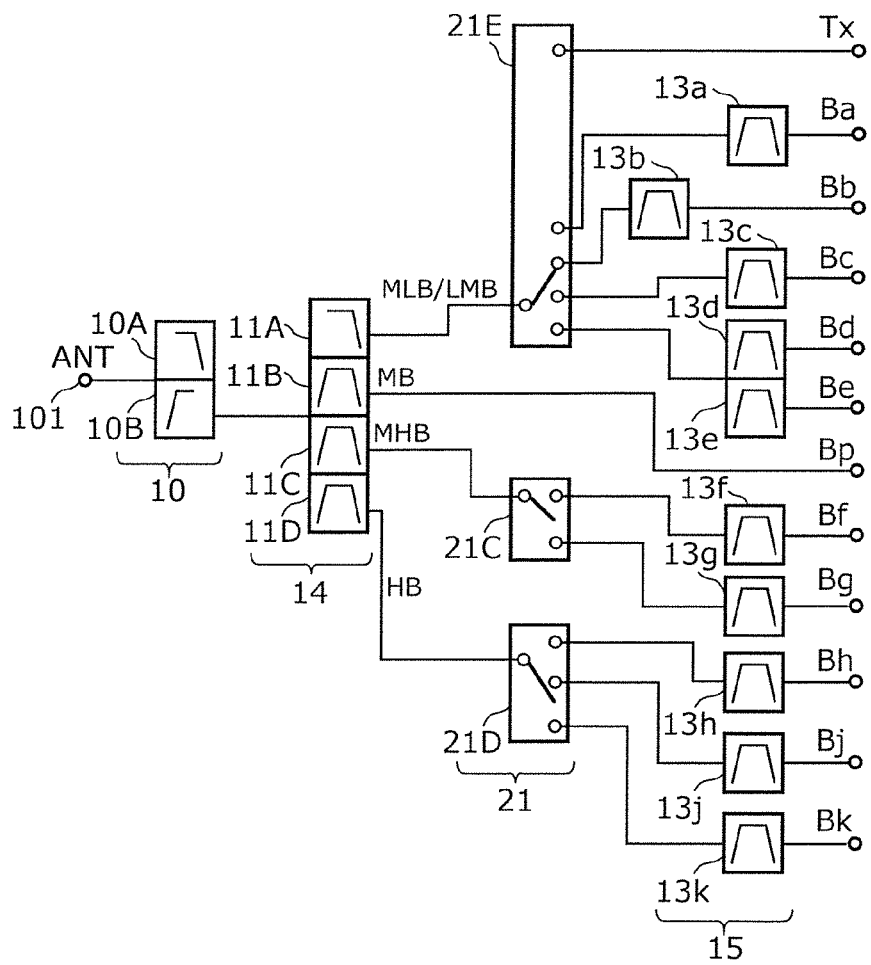
FIG. 5B is a circuit configuration diagram of an RF front-end circuit according to a sixth modification example of the first preferred embodiment of the present invention.

FIG. 5B is a circuit configuration diagram of an RF front-end circuit 2B according to a sixth modification example of the first preferred embodiment. The RF front-end circuit 2B according to the sixth modification example is different from the RF front-end circuit 2 according to the fourth modification example in that a transmission (Tx) bypass path is included. Hereinafter, the RF front-end circuit 2B according to the sixth modification example will be described. The description will be given mainly of a difference from the RF front-end circuit 2 according to the fourth modification example, and the description of the same point will be omitted.

The RF front-end circuit 2B includes the antenna common terminal 101, the demultiplexing circuit 10 (low pass filter 10A and high pass filter 10B), the demultiplexing circuit 14 (MLB filter 11A, MBb filter 11B, MHBa filter 11C, and HBb filter 11D), the switch 21 (switch 21E, switch 21C, and switch 21D), the switch (not illustrated), the filter circuit 15 (filters 13a to 13k), and the amplifying circuit 30 (not illustrated).

The switch 21 includes the switches 21E, 21C, and 21D.

The switch 21E includes a common terminal connected to the MLB filter 11A, and selection terminals respectively connected to the transmission (Tx) bypass path and the filters 13a (Ba), 13b (Bb), 13c (Bc), and 13d/13e (Bd/Be).

The transmission (Tx) bypass path is a path through which a transmission signal in a band belonging to MLB/LMB propagates, for example, a path through which a signal in at least one transmission band among Band a, Band b, Band c, Band d, and Band e propagates.

The pass band of the MLB filter 11A (about 1475.9-2025 MHz) is wider than the transmission pass band of the transmission (Tx) bypass path and the pass band of each of the filters 13a (Ba), 13b (Bb), 13c (Bc), and 13d/13e (Bd/Be), and includes these individual pass bands. The pass band of the MBb filter 11B (about 2110-2200 MHz) includes the pass band of Bp. The pass band of the MHBa filter 11C (about 2300-2400 MHz or about 2300-2370 MHz) is wider than the pass band of each of the filters 13f (Bf) and 13g (Bg) and includes these individual pass bands. The pass band of the HBb filter 11D (about 2496-2690 MHz) is wider than the pass band of each of the filters 13*h* (Bh), 13*j* (Bj), and 13*k* (Bk), and includes these individual pass bands, for example.

With the above-described configuration, a signal path connecting the transmission (Tx) bypass path, the switch 21E, the MLB filter 11A, the high pass filter 10B, and the antenna common terminal 101 are able to be used as a transmission signal path.

In the above-described configuration, a CA operation is able to be performed on a transmission signal belonging to MLB/LMB and a reception signal belonging to MB, MHB, and HB by using an antenna connected to the antenna common terminal 101. That is, the antenna connected to the antenna common terminal 101 is able to be used as not only an antenna for reception but also an antenna for transmission and reception.

In the sixth modification example, the transmission (Tx) bypass path is connected to the switch 21E that switches the band in MLB/LMB. Alternatively, the transmission (Tx) bypass path may be connected to the switch 21C that switches the band in MHB or the switch 21D that switches the band in HB.

Figure 5C:
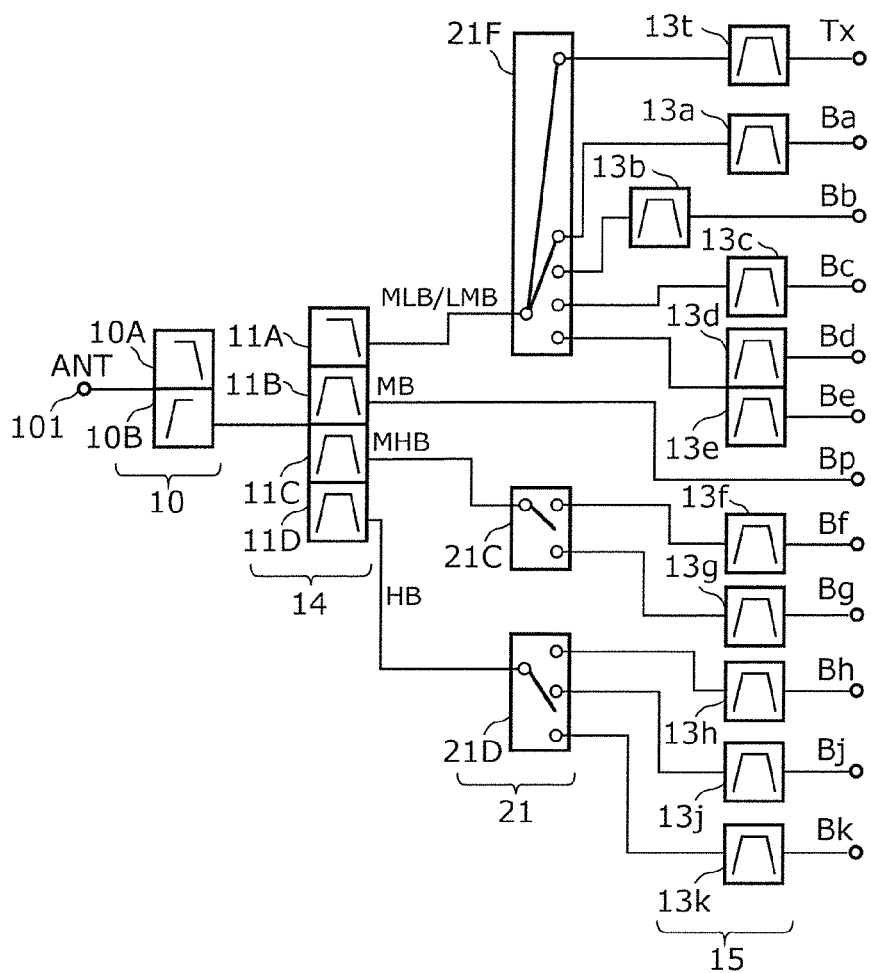
FIG. 5C is a circuit configuration diagram of an RF front-end circuit according to a seventh modification example of the first preferred embodiment of the present invention.

FIG. 5C is a circuit configuration diagram of an RF front-end circuit 2C according to a seventh modification example of the first preferred embodiment. The RF front-end circuit 2C according to the seventh modification example is different from the RF front-end circuit 2 according to the fourth modification example in that a transmission (Tx) path including a transmission filter is included. Hereinafter, the RF front-end circuit 2C according to the seventh modification example will be described. The description will be given mainly of a difference from the RF front-end circuit 2 according to the fourth modification example, and the description of the same point will be omitted.

The RF front-end circuit 2C includes the antenna common terminal 101, the demultiplexing circuit 10 (low pass filter 10A and high pass filter 10B), the demultiplexing circuit 14 (MLB filter 11A, MBb filter 11B, MHBa filter 11C, and HBb filter 11D), the switch 21 (switch 21F, switch 21C, and switch 21D), the switch 22 (not illustrated), the filter circuit 15 (filters 13*a* to 13*k* and transmission filter 13*t*), and the amplifying circuit 30 (not illustrated).

The switch 21 includes the switches 21F, 21C, and 21D.

The switch 21F includes a common terminal connected to the MLB filter 11A, and selection terminals respectively connected to the transmission (Tx) path and the filters 13*a* (Ba), 13*b* (Bb), 13*c* (Bc), and 13*d*/13*e* (Bd/Be). The switch 21F is a switch capable of simultaneously connecting the common terminal and two or more selection terminals to each other.

The transmission filter 13*t* is disposed on the transmission (Tx) path.

The pass band of the MLB filter 11A (about 1475.9-2025 MHz) is wider than the pass band of each of the transmission filter 13*t* and the filters 13*a* (Ba), 13*b* (Bb), 13*c* (Bc), and 13*d*/13*e* (Bd/Be), and includes these individual pass bands. The pass band of the MBb filter 11B (about 2110-2200 MHz) includes the pass band of Bp, for example. The pass band of the MHBa filter 11C (about 2300-2400 MHz or about 2300-2370 MHz) is wider than the pass band of each of the filters 13*f* (Bf) and 13*g* (Bg) and includes these individual pass bands, for example. The pass band of the HBb filter 11D (about 2496-2690 MHz) is wider than the pass band of each of the filters 13*h* (Bh), 13*j* (Bj), and 13*k* (Bk), and includes these individual pass bands, for example.

With the above-described configuration, a transmission signal path connecting the transmission (Tx) path, the switch 21F, the MLB filter 11A, the high pass filter 10B, and the antenna common terminal 101; and a reception signal path connecting the antenna common terminal 101, the high pass filter 10B, the MLB filter 11A, the switch 21F, and any one of the filters 13*a* to 13*e* are able to be simultaneously used. Accordingly, simultaneous transmission and reception are able to be performed in the same band. Furthermore, the antenna connected to the antenna common terminal 101 is able to be used as not only an antenna for reception but also an antenna for transmission and reception.

Furthermore, a configuration in which the transmission (Tx) path is also connected to an RF front-end circuit different from the RF front-end circuit 2C may be assumed. In this case, a so-called 2-uplink transmission operation with two antennas is able to be performed by using the RF front-end circuit 2C and the different RF front-end circuit.

In the seventh modification example, the transmission (Tx) path is connected to the switch 21F that switches the band in MLB/LMB. Alternatively, the transmission (Tx) path may be connected to the switch 21C that switches the band in MHB or the switch 21D that switches the band in HB.

Figure 5D:
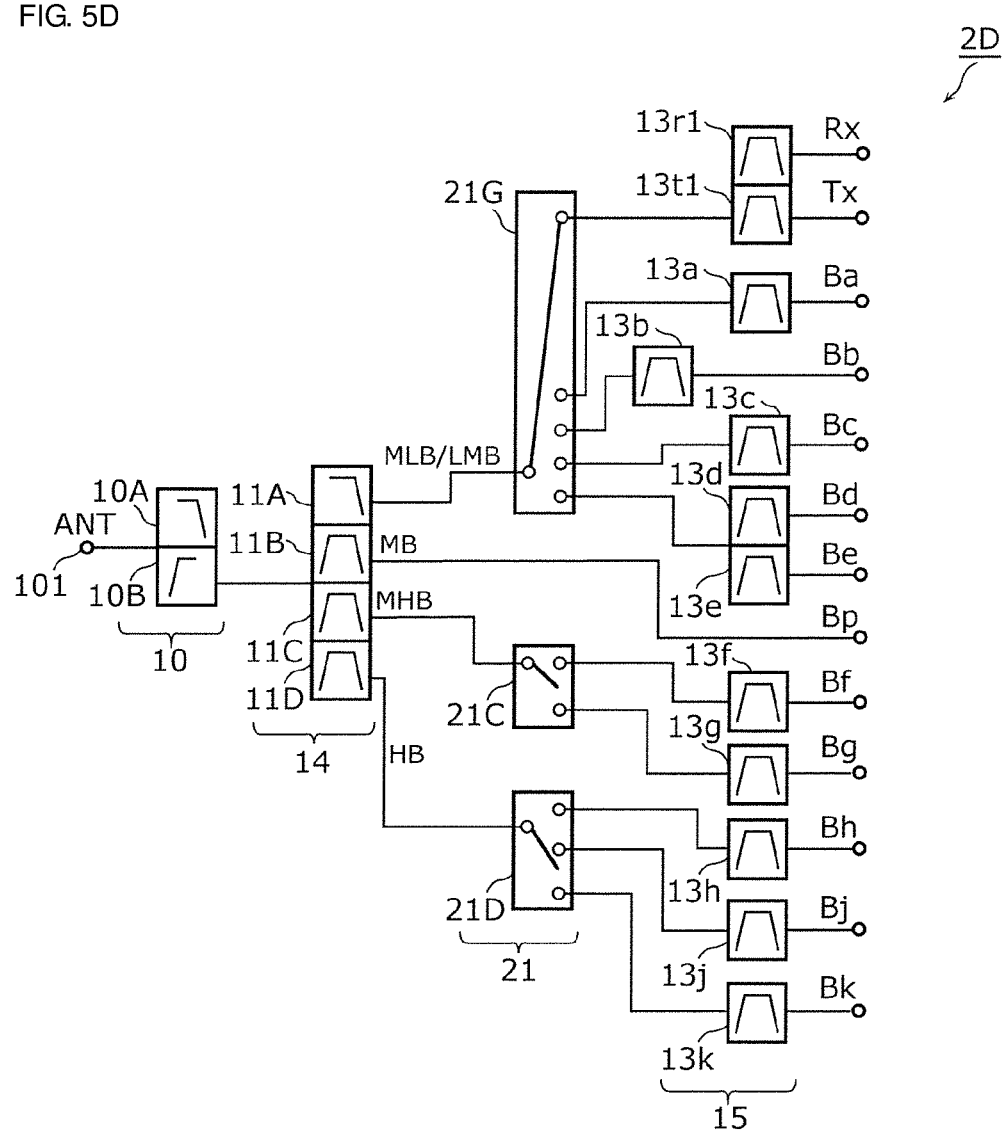
FIG. 5D is a circuit configuration diagram of an RF front-end circuit according to an eighth modification example of the first preferred embodiment of the present invention.

FIG. 5D is a circuit configuration diagram of an RF front-end circuit 2D according to an eighth modification example of the first preferred embodiment. The RF front-end circuit 2D according to the eight modification example is different from the RF front-end circuit 2 according to the fourth modification example in that a transmission/reception (Tx/Rx) path including a duplexer is included. Hereinafter, the RF front-end circuit 2D according to the eighth modification example will be described. The description will be given mainly of a difference from the RF front-end circuit 2 according to the fourth modification example, and the description of the same point will be omitted.

The RF front-end circuit 2D includes the antenna common terminal 101, the demultiplexing circuit 10 (low pass filter 10A and high pass filter 10B), the demultiplexing circuit 14 (MLB filter 11A, MBb filter 11B, MHBa filter 11C, and HBb filter 11D), the switch 21 (switch 21G, switch 21C, and switch 21D), the switch 22 (not illustrated), the filter circuit 15 (filters 13*a* to 13*k*), and the amplifying circuit 30 (not illustrated).

The switch 21 includes the switches 21G, 21C, and 21D.

The switch 21G includes a common terminal connected to the MLB filter 11A, and selection terminals respectively connected to the transmission/reception (Tx/Rx) path and the filters 13*a* (Ba), 13*b* (Bb), 13*c* (Bc), and 13*d*/13*e* (Bd/Be).

A duplexer including a transmission filter 13*t*1 and a reception filter 13*r*1 is disposed on the transmission/reception (Tx/Rx) path.

The pass band of the MLB filter 11A (about 1475.9-2025 MHz) is wider than the pass band of each of the duplexer disposed on the transmission/reception (Tx/Rx) path and the filters 13*a* (Ba), 13*b* (Bb), 13*c* (Bc), and 13*d*/13*e* (Bd/Be), and includes these individual pass bands, for example. The pass band of the MBb filter 11B (about 2110-2200 MHz) includes the pass band of Bp. The pass band of the MHBa filter 11C (about 2300-2400 MHz or about 2300-2370 MHz) is wider than the pass band of each of the filters 13*f* (Bf) and 13*g* (Bg) and includes these individual pass bands, for example. The pass band of the HBb filter 11D (about 2496-2690 MHz) is wider than the pass band of each of the filters 13*h* (Bh), 13*j* (Bj), and 13*k* (Bk), and includes these individual pass bands, for example.

With the above-described configuration, a signal path connecting the transmission/reception (Tx/Rx) path, the switch 21G, the MLB filter 11A, the high pass filter 10B, and the antenna common terminal 101 are able to be used. Accordingly, a transmission signal and a reception signal in the same band propagating through the transmission/reception (Tx/Rx) path are able to be simultaneously transmitted and received. Furthermore, the antenna connected to the antenna common terminal 101 is able to be used as not only an antenna for reception but also an antenna for transmission and reception.

Furthermore, a configuration in which the transmission/reception (Tx/Rx) path is also connected to an RF front-end circuit different from the RF front-end circuit 2D may be assumed. In this case, a so-called 2-uplink transmission operation with two antennas is able to be performed by using the RF front-end circuit 2D and the different RF front-end circuit.

In the eighth modification example, the transmission/reception (Tx/Rx) path is connected to the switch 21G that switches the band in MLB/LMB. Alternatively, the transmission/reception (Tx/Rx) path may be connected to the switch 21C that switches the band in MHB or the switch 21D that switches the band in HB.

Second Preferred Embodiment

According to the description of the first preferred embodiment given above, in a configuration in which the first filter 11 and the second filter 12 are connected in common to the antenna common terminal and the first filter 11 and the third filter 13 are connected in series to each other with a switch interposed therebetween, it is preferable that a reflection coefficient be preferentially increased in the first filter 11 having a greater influence on reflection characteristics, and that filter characteristics including bandpass characteristics, attenuation characteristics, temperature characteristics, and a bandwidth be ensured in the third filter 13 having a smaller influence on reflection characteristics. From this point of view, examples of a combination of structures of the first filter 11 and the third filter 13 will be described with referenced to a second preferred embodiment of the present invention.

In the second preferred embodiment, each of the first filter 11 and the third filter 13 includes an elastic wave resonator and may have a ladder filter structure. In this case, one or more elastic wave resonators located near the antenna common terminal 101 include at least one of a series-arm resonator and a parallel-arm resonator. Accordingly, an insertion loss resulting from the first filter 11 or/and the third filter 13 in the total insertion loss of the second filter 12 in the second pass band is able to be decreased while ensuring low-loss characteristics of the first filter 11 and the third filter 13.

Each of the first filter 11 and the third filter 13 may have a longitudinally coupled filter structure. Accordingly, the first filter 11 and the third filter 13 are able to be adapted to filter characteristics in which increased attenuation is required.

Examples of the elastic wave resonator include a surface acoustic wave (SAW) resonator, a solidly mounted resonator (SMR), and a film bulk acoustic resonator (FBAR) that uses a bulk acoustic wave (BAW).

Here, each of the first filter 11 and the third filter 13 may include two or more elastic wave resonators, and a reflection coefficient of one or more elastic wave resonators alone disposed near the antenna common terminal 101 among the two or more elastic wave resonators included in the first filter 11 in the second pass band viewed from the antenna common terminal 101 may be larger than a reflection coefficient of one or more elastic wave resonators alone disposed near the antenna common terminal 101 among the two or more elastic wave resonators included in the third filter 13 in the second pass band viewed from the antenna common terminal 101.

In a filter including a plurality of elastic wave resonators, a reflection coefficient viewed from the antenna common terminal 101 is dominant in one elastic wave resonator that is nearest to the antenna common terminal 101. Accordingly, an insertion loss resulting from the first filter 11 or/and the third filter 13 in the total insertion loss of the second filter 12 in the second pass band is able to be effectively decreased.

Hereinafter, a description will be given of examples of a combination of specific configurations for increasing a reflection coefficient of the first filter 11 in a preceding stage and improving filter characteristics including bandpass characteristics, attenuation characteristics, temperature characteristics, and a bandwidth of the third filter 13 in a subsequent stage.

First, an example structure of an elastic wave resonator will be described.

Figure 6:
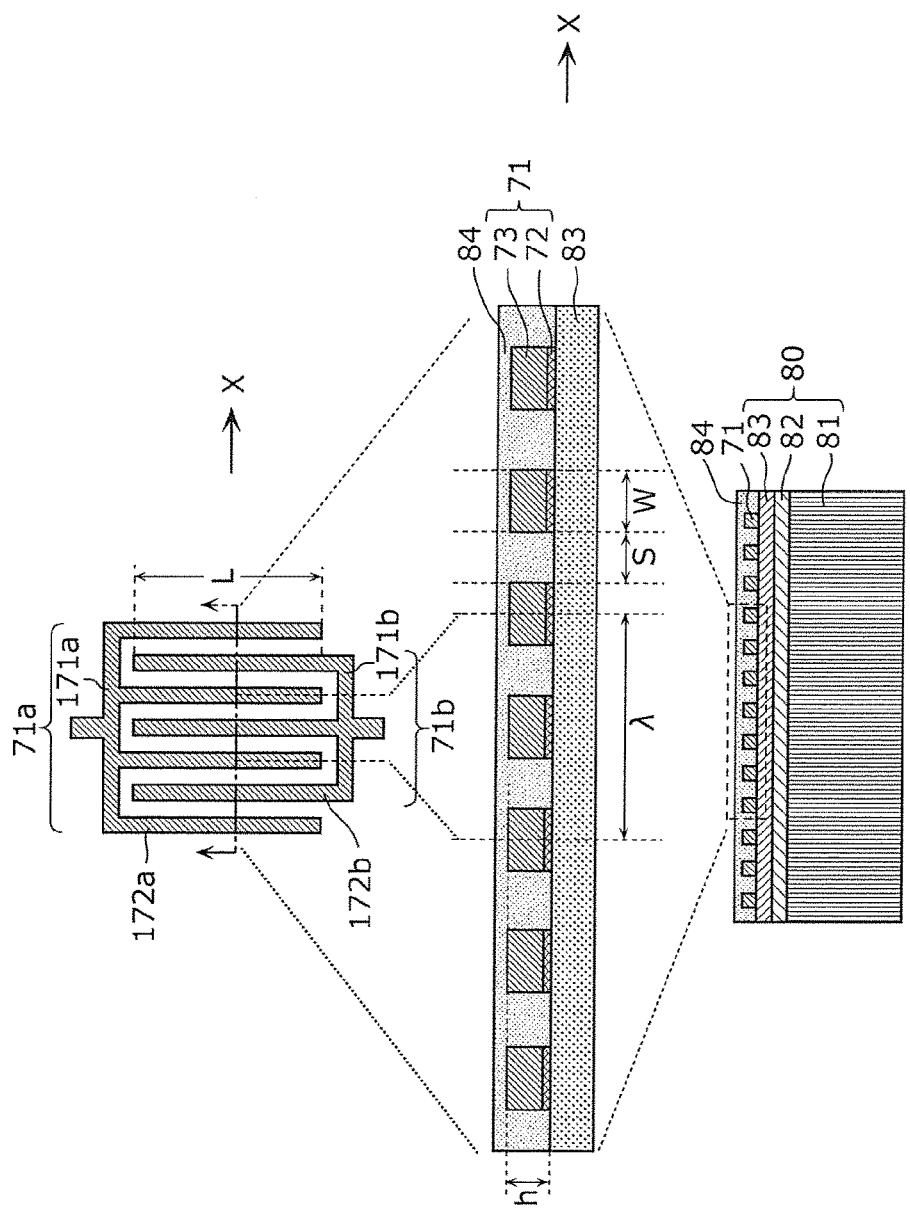
FIG. 6 is an example of a plan view and a cross-sectional view schematically illustrating a filter resonator according to a second preferred embodiment of the present invention.

FIG. 6 is an example of a plan view and a cross-sectional view schematically illustrating a filter resonator according to the second preferred embodiment. FIG. 6 illustrates a case where the elastic wave resonators (series-arm resonator and parallel-arm resonator) according to the second preferred embodiment are surface acoustic wave (SAW) resonators, for example. FIG. 6 is an example of a schematic plan view and a schematic cross-sectional view illustrating the structure of one of a plurality of elastic wave resonators of the first filter 11 and the third filter 13. The elastic wave resonator illustrated in FIG. 6 is for describing a typical structure of each of the plurality of resonators, and the number and length of electrode fingers of an electrode are not limited to those illustrated in FIG. 6.

Each resonator of the first filter 11 and the third filter 13 includes a substrate 80 including a piezoelectric layer 83 and interdigital transducer (IDT) electrodes 71a and 71b that are substantially comb-shaped.

As illustrated in the plan view of FIG. 6, a pair of IDT electrodes 71a and 71b facing each other are disposed on the piezoelectric layer 83. The IDT electrode 71a includes a plurality of electrode fingers 172a that are parallel with one another and a busbar electrode 171a that connects the plurality of electrode fingers 172a. The IDT electrode 71b includes a plurality of electrode fingers 172b that are parallel with one another and a busbar electrode 171b that connects the plurality of electrode fingers 172b. The plurality of electrode fingers 172a and the plurality of electrode fingers 172b are arranged in a direction orthogonal to an X-axis direction.

The IDT electrode 71, which includes the plurality of electrode fingers 172a, the plurality of electrode fingers 172b, the busbar electrode 171a, and the busbar electrode 171b, has a multilayer structure including an adhesion layer 72 and a main electrode layer 73, as illustrated in the cross-sectional view in FIG. 6.

The adhesion layer 72 is a layer that increases adhesion between the piezoelectric layer 83 and the main electrode layer 73 and is composed of Ti, for example. The adhesion layer 72 preferably has a thickness of about 10 nm, for example.

The main electrode layer 73 preferably is composed of Al containing about 1% Cu, for example. The main electrode layer 73 preferably has a thickness of about 130 nm, for example.

A protective film 84 is disposed so as to cover the IDT electrodes 71a and 71b. The protective film 84 is a layer that protects the main electrode layer 73 from an external environment, adjusts frequency-temperature characteristics, and enhances moisture resistance, and is, for example, a film containing silicon dioxide as a main component. The protective film 84 preferably has a thickness of about 30 nm, for example.

The materials of the adhesion layer 72, the main electrode layer 73, and the protective film 84 are not limited to the foregoing materials. The IDT electrode 71 does not necessarily have the foregoing multilayer structure. The IDT electrode 71 may be composed of metal such as Ti, Al, Cu, Pt, Au, Ag, or Pd, or an alloy, or may be a plurality of multilayer bodies composed of the foregoing metal or alloy. The protective film 84 is not necessarily disposed.

Next, the multilayer structure of the substrate 80 will be described.

As illustrated in the lower portion of FIG. 6, the substrate 80 includes a high-acoustic-velocity supporting substrate 81, a low-acoustic-velocity film 82, and the piezoelectric layer 83, and has a multilayer structure (acoustic-velocity-film multilayer structure) in which the high-acoustic-velocity supporting substrate 81, the low-acoustic-velocity film 82, and the piezoelectric layer 83 are laminated in this order.

The piezoelectric layer 83 is composed of, for example, a 42° Y-cut X-propagation LiTaO$_3$ piezoelectric single crystal or piezoelectric ceramics (a lithium tantalate single crystal cut along a plane including a normal that is the Y axis rotated by 42° around the X axis as the central axis or ceramics, that is, a single crystal or ceramics through which a surface acoustic wave propagates in the X-axis direction). In this case, the elastic wave resonator uses a leaky wave as an elastic wave.

Alternatively, the piezoelectric layer 83 is composed of, for example, a 128° Y-cut X-propagation LiNbO$_3$ piezoelectric single crystal or piezoelectric ceramics. In this case, the elastic wave resonator uses a Rayleigh wave as an elastic wave.

Alternatively, the piezoelectric layer 83 is composed of, for example, a Y-cut X-propagation LiNbO$_3$ piezoelectric single crystal or piezoelectric ceramics. In this case, the elastic wave resonator uses a Love wave as an elastic wave.

The single crystal material, cut-angles, and multilayer structure of the piezoelectric layer 83 are appropriately selected in accordance with required specifications of the filter (filter characteristics including bandpass characteristics, attenuation characteristics, temperature characteristics, and a bandwidth).

The high-acoustic-velocity supporting substrate 81 is a substrate that supports the low-acoustic-velocity film 82, the piezoelectric layer 83, and the IDT electrode 71. The high-acoustic-velocity supporting substrate 81 is a substrate through which a bulk wave propagates at an acoustic velocity higher than an acoustic velocity of an elastic wave, such as a surface acoustic wave or a boundary wave, that propagates through the piezoelectric layer 83, and functions to confine a surface acoustic wave within a portion where the piezoelectric layer 83 and the low-acoustic-velocity film 82 are laminated one on top of another and to prevent the surface acoustic wave from leaking below the high-acoustic-velocity supporting substrate 81. The high-acoustic-velocity supporting substrate 81 is a silicon substrate, for example, and has a thickness of about 200 μm, for example. The high-acoustic-velocity supporting substrate 81 may be composed of any one of (1) a piezoelectric body such as aluminum nitride, aluminum oxide, silicon carbide, silicon nitride, silicon, sapphire, lithium tantalate, lithium niobate, or crystal; (2) various types of ceramic such as alumina, zirconia, cordierite, mullite, steatite, or forsterite; (3) magnesia diamond; (4) material containing any one of the foregoing materials as a main component; and (5) material containing a mixture of the foregoing materials as a main component.

The low-acoustic-velocity film 82 is a film through which a bulk wave propagates at an acoustic velocity lower than an acoustic velocity of an elastic wave that propagates through the piezoelectric layer 83, and is disposed between the piezoelectric layer 83 and the high-acoustic-velocity supporting substrate 81. With this structure and a property that energy concentrates in a medium through which an elastic wave propagates at an essentially low acoustic velocity, leakage of a surface acoustic wave energy to the outside of the IDT electrode is suppressed. The low-acoustic-velocity film 82 is a film containing silicon dioxide as a main component, for example. The low-acoustic-velocity film 82 preferably has a thickness of about 500 nm, for example.

According to the above-described acoustic-velocity-film multilayer structure of the substrate 80, a Q value at a resonant frequency and an anti-resonant frequency is able to be significantly increased compared to a structure according to the related art in which a piezoelectric substrate is used as a single layer. That is, a SAW resonator with a large Q value is able to be configured and thus a filter with a low insertion loss is able to be configured by using the SAW resonator.

The high-acoustic-velocity supporting substrate 81 may have a multilayer structure including a supporting substrate and a high-acoustic-velocity film through which a bulk wave propagates at an acoustic velocity higher than an acoustic velocity of an elastic wave, such as a surface acoustic wave or boundary wave, that propagates through the piezoelectric layer 83. In this case, the supporting substrate may include a piezoelectric body such as sapphire, lithium tantalate, lithium niobate, or crystal; various types of ceramic such as alumina, magnesia, silicon nitride, aluminum nitride, silicon carbide, zirconia, cordierite, mullite, steatite, or forsterite; a dielectric body such as glass, or semiconductor such as silicon or gallium nitride, and a resin substrate. The high-acoustic-velocity film may be composed of various high-acoustic-velocity materials such as aluminum nitride, aluminum oxide, silicon carbide, silicon nitride, silicon oxynitride, DLC film or diamond, a medium containing any of the foregoing materials as a main component, or a medium containing a mixture of the foregoing materials as a main component.

In the description given above, the IDT electrode 71 of an elastic wave resonator is disposed on the substrate 80 including the piezoelectric layer 83. Alternatively, the substrate on which the IDT electrode 71 is disposed may be a piezoelectric substrate including the piezoelectric layer 83 as a single layer. In this case, the piezoelectric substrate is composed of, for example, a piezoelectric single crystal of LiTaO$_3$ or another piezoelectric single crystal of LiNbO$_3$ or the like.

The substrate on which the IDT electrode 71 is disposed may have either a single layer structure including a single piezoelectric layer or a multilayer structure in which a piezoelectric layer is laminated on a supporting substrate, as long as the substrate includes the piezoelectric layer 83.

Now, the design parameters of the IDT electrode 71 will be described. The wavelength of the SAW resonator is defined by a wavelength λ, which is a repetition period of the plurality of electrode fingers 172a or 172b included in the IDT electrode 71 illustrated in the middle portion of FIG. 6.

The electrode pitch is half the wavelength λ and is defined as (W+S) where W represents a line width of each of the electrode fingers 172a and 172b included in the IDT electrodes 71a and 71b, respectively, and S represents a space width between an electrode finger 172a and an electrode finger 172b adjacent to each other. An intersecting width L of the IDT electrodes 71a and 71b is a length over which the electrode fingers 172a of the IDT electrode 71a and the electrode fingers 172b of the IDT electrode 71b intersect each other, viewed in the X-axis direction in the upper portion of FIG. 6. The electrode duty ratio of each resonator is a ratio of the line widths of the plurality of electrode fingers 172a and 172b, that is, a ratio of the line widths of the plurality of electrode fingers 172a and 172b to the sum of the line widths and the space widths, and is defined by W/(W+S).

Hereinafter, a description will be given of an example of a combination of specific configurations to increase the reflection coefficient of the first filter 11 and improving filter characteristics including bandpass characteristics, attenuation characteristics, temperature characteristics, and a bandwidth of the third filter 13.

Figures 7A, 7B:
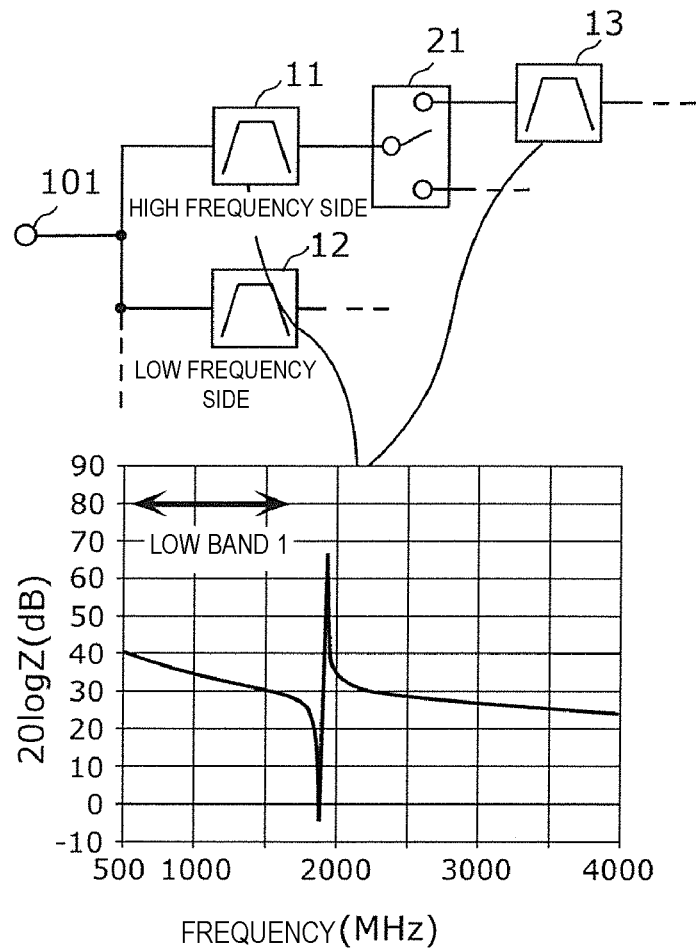
FIG. 7A is a diagram for describing reflection characteristics in a low band of an RF front-end circuit according to the second preferred embodiment of the present invention.
FIG. 7B is a diagram illustrating combinations of configurations of a first filter and a third filter according to the second preferred embodiment of the present invention.

FIG. 7A is a diagram for describing reflection characteristics in a low band 1 of the RF front-end circuit according to the second preferred embodiment. As illustrated in the lower portion of FIG. 7A, there are a resonant point at which the impedance has a minimum value and an anti-resonant point at which the impedance has a maximum value in the impedance characteristics of the elastic wave resonator. In a region on the low frequency side of the resonant point (low band 1 in FIG. 7A), the impedance varies according to the structure of the elastic wave resonator, and the reflection characteristics are improved or degraded according to the impedance. More specifically, a return loss in the low band 1 is larger when the elastic wave resonator has a structure in which any one of (1) a Rayleigh wave that propagates through a piezoelectric layer composed of LiNbO$_3$, (2) a leaky wave that propagates through a piezoelectric layer composed of LiTaO$_3$, and (3) a Love wave that propagates through a piezoelectric layer composed of LiNbO$_3$ is used as a surface acoustic wave, or when the elastic wave resonator has (4) the above-described acoustic-velocity-film multilayer structure, than when the elastic wave resonator is an SMR or FBAR.

FIG. 7B is a diagram illustrating combinations of the configurations of the first filter 11 and the third filter 13 according to the second preferred embodiment.

In a case where the first pass band of the first filter 11 is on the high frequency side relative to the second pass band of the second filter 12 in accordance with the above-described relationship in reflection coefficients, the first filter 11 of the RF front-end circuit according to the second preferred embodiment may have a structure in which any one of (1) a Rayleigh wave that propagates through a piezoelectric layer composed of LiNbO$_3$, (2) a leaky wave that propagates through a piezoelectric layer composed of LiTaO$_3$, and (3) a Love wave that propagates through a piezoelectric layer composed of LiNbO$_3$ is used as a surface acoustic wave, as illustrated in FIG. 7B.

Accordingly, it is possible to make the reflection coefficient of the first filter 11 in the second pass band (the pass band of the second filter 12) larger than the reflection coefficient of the third filter 13 in the second pass band (the pass band of the second filter 12) in the RF front-end circuit. Thus, an insertion loss resulting from the first filter 11 or/and the third filter 13 in the total insertion loss in the second pass band of the second filter 12 is able to be decreased.

On the other hand, the elastic wave resonator may be an SMR or FBAR in the third filter 13.

Accordingly, a low loss and a steepness in the pass band of the second filter 12 are able to be ensured by using the above-described configuration of the third filter 13, with the reflection coefficient of the second filter 12 being increased by using the configuration of the first filter 11.

As illustrated in FIG. 7B, each elastic wave resonator included in the first filter 11 may have the above-described acoustic-velocity-film multilayer structure, and each elastic wave resonator included in the third filter 13 may be an SMR or FBAR.

Accordingly, it is possible to make the reflection coefficient of the first filter 11 in the second pass band (the pass band of the second filter 12) larger than the reflection coefficient of the third filter 13 in the second pass band (the pass band of the second filter 12) in the RF front-end circuit. Thus, an insertion loss resulting from the first filter 11 or/and the third filter 13 in the total insertion loss in the second pass band of the second filter 12 is able to be decreased. Accordingly, a low loss and a steepness in the pass band of the second filter 12 are able to be ensured by using the above-described configuration of the third filter 13, with the reflection coefficient of the second filter 12 being increased by using the configuration of the first filter 11.

FIG. 8A is a diagram for describing leakage of a bulk wave in a high band 1 of the RF front-end circuit according to a first modification example of the second preferred embodiment. As illustrated in the lower portion of FIG. 8A, in a region on the high frequency side of the anti-resonant point of the elastic wave resonator (high band 1 in FIG. 8A), the impedance is changed by leakage of a bulk wave (unnecessary wave), and the reflection characteristics are improved or degraded according to the change in the impedance. More specifically, a return loss in the high band 1 caused by leakage of a bulk wave increases in the order of (1) a structure in which a Rayleigh wave that propagates through a piezoelectric layer composed of LiNbO$_3$ is used as an elastic wave, SMR, or FBAR, (2) the acoustic-velocity-film multilayer structure, (3) a structure in which a leaky wave that propagate through a piezoelectric layer composed of LiTaO$_3$ is used as an elastic wave, and (4) a structure in which a Love wave that propagates through a piezoelectric layer composed of LiNbO$_3$ is used as an elastic wave.

FIG. 8B is a diagram illustrating combinations of the configurations of the first filter 11 and the third filter 13 according to the first modification example of the second preferred embodiment.

In a case where the first pass band of the first filter 11 is on the low frequency side relative to the second pass band of the second filter 12 in accordance with the degree of return loss, the first filter 11 on the low frequency side of the RF front-end circuit may have any one of (1) a structure in which a Rayleigh wave that propagates through a piezoelectric layer composed of LiNbO$_3$ is used as a surface acoustic wave, (2) a structure in which an elastic wave resonator is an SMR, and (3) a structure in which an elastic wave resonator is an FBAR, as illustrated in FIG. 8B.

Accordingly, it is possible to make the reflection coefficient of the first filter 11 on the low frequency side in the second pass band (the pass band of the second filter 12 on the high frequency side) larger than the reflection coefficient of the third filter 13 in the second pass band (the pass band of the second filter 12 on the high frequency side) in the RF front-end circuit. Thus, an insertion loss resulting from the first filter 11 or/and the third filter 13 in the total insertion loss in the second pass band of the second filter 12 is able to be decreased.

On the other hand, the third filter 13 may have any one of (1) the above-described acoustic-velocity-film multilayer structure, (2) a structure in which a leaky wave that propagates through a piezoelectric layer composed of $LiTaO_3$ is used as a surface acoustic wave, and (3) a structure in which a Love wave that propagates through a piezoelectric layer composed of $LiNbO_3$ is used as a surface acoustic wave.

Accordingly, in a case where the third filter 13 has the acoustic-velocity-film multilayer structure, a low loss and favorable temperature characteristics of the third filter 13 is able to be ensured, with the reflection coefficient of the first filter 11 being increased by its structure. Furthermore, in a case where a Love wave that propagates through a piezoelectric layer composed of $LiNbO_3$ is used as a surface acoustic wave in the third filter 13, a wide bandwidth is able to be ensured in the third filter 13.

In the first filter 11, the elastic wave resonator may have the above-described acoustic-velocity-film multilayer structure. In the third filter 13, the elastic wave resonator may have (1) a structure in which a leaky wave that propagates through a piezoelectric layer composed of $LiTaO_3$ is used as a surface acoustic wave, or (2) a structure in which a Love wave that propagates through a piezoelectric layer composed of $LiNbO_3$ is used as a surface acoustic wave.

Accordingly, it is possible to make the reflection coefficient of the first filter 11 on the low frequency side in the second pass band (the pass band of the second filter 12 on the high frequency side) larger than the reflection coefficient of the third filter 13 in the second pass band (the pass band of the second filter 12 on the high frequency side) in the RF front-end circuit. Thus, an insertion loss resulting from the first filter 11 or/and the third filter 13 in the total insertion loss in the second pass band of the second filter 12 is able to be decreased. Furthermore, in a case where a Love wave that propagates through a piezoelectric layer composed of $LiNbO_3$ is used as a surface acoustic wave in the third filter 13, a wide bandwidth is able to be ensured in the third filter 13.

The first filter 11 may have a structure in which a leaky wave that propagates through a piezoelectric layer composed of $LiTaO_3$ is used as a surface acoustic wave. The third filter 13 may have a structure in which a Love wave that propagates through a piezoelectric layer composed of $LiNbO_3$ is used as a surface acoustic wave.

Accordingly, it is possible to make the reflection coefficient of the first filter 11 on the low frequency side in the second pass band (the pass band of the second filter 12 on the high frequency side) larger than the reflection coefficient of the third filter 13 in the second pass band (the pass band of the second filter 12 on the high frequency side) in the RF front-end circuit. Thus, an insertion loss resulting from the first filter 11 or/and the third filter 13 in the total insertion loss in the second pass band of the second filter 12 is able to be decreased. Furthermore, in a case where a Love wave that propagates through a piezoelectric layer composed of $LiNbO_3$ is used as a surface acoustic wave in the third filter 13, a wide bandwidth is able to be ensured in the third filter 13.

Figures 9A, 9B:
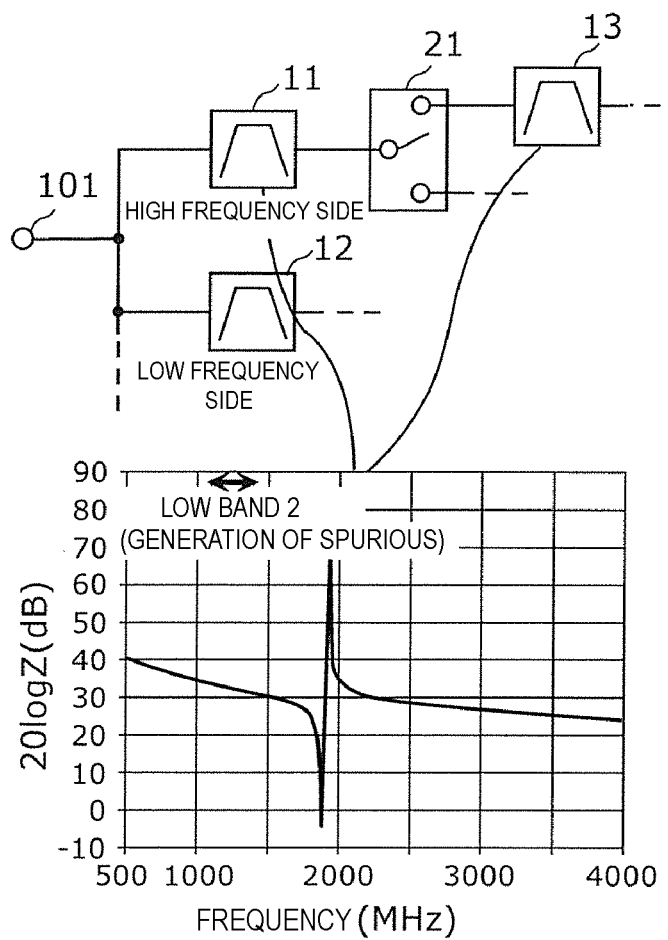
FIG. 9A is a diagram for describing generation of a spurious wave in a low band of an RF front-end circuit according to a second modification example of the second preferred embodiment of the present invention.
FIG. 9B is a diagram illustrating combinations of configurations of the first filter and the third filter according to the second modification example of the second preferred embodiment of the present invention.

FIG. 9A is a diagram for describing generation of a spurious wave in a low band 2 of the RF front-end circuit according to a second modification example of the second preferred embodiment. As illustrated in the lower portion of FIG. 9A, in a region on the low frequency side of the resonant point of the elastic wave resonator (low band 2 in FIG. 9A), a spurious Rayleigh wave is generated at the vicinity of about 0.76 times the resonant frequency, for example, particularly in the above-described acoustic-velocity-film multilayer structure or in a structure in which a leaky wave that propagates through a piezoelectric layer composed of $LiTaO_3$ is used as an elastic wave. The generated spurious wave changes impedance, and the change in impedance causes the reflection coefficient to be decreased.

FIG. 9B is a diagram illustrating combinations of the configurations of the first filter 11 and the third filter 13 according to the second modification example of the second preferred embodiment.

In a case where the first pass band of the first filter 11 is on the high frequency side relative to the second pass band of the second filter 12, the first filter 11 may have any one of (1) a structure in which a Rayleigh wave that propagates through a piezoelectric layer composed of $LiNbO_3$ is used as a surface acoustic wave, (2) a structure in which a leaky wave that propagates through a piezoelectric layer composed of $LiTaO_3$ is used as a surface acoustic wave, (3) a structure in which a Love wave that propagates through a piezoelectric layer composed of $LiNbO_3$ is used as a surface acoustic wave, (4) a structure in which the elastic wave resonator is an SMR, and (5) a structure in which the elastic wave resonator is an FBAR, and the elastic wave resonator of the third filter 13 may have the above-described acoustic-velocity-film multilayer structure, as illustrated in FIG. 9B.

That is, when the third filter 13 has the acoustic-velocity-film multilayer structure and the first filter 11 does not have the acoustic-velocity-film multilayer structure, the reflection coefficient of the first filter 11 in the second pass band (the pass band of the second filter 12 on the low frequency side) is able to be increased. Accordingly, an insertion loss resulting from the first filter 11 or/and the third filter 13 in the total insertion loss in the second pass band of the second filter 12 is able to be decreased in the RF front-end circuit.

Alternatively, as illustrated in FIG. 9B, the first filter 11 may have any one of (1) a structure in which a Rayleigh wave that propagates through a piezoelectric layer composed of $LiNbO_3$ is used as a surface acoustic wave, (2) a structure in which a Love wave that propagates through a piezoelectric layer composed of $LiNbO_3$ is used as a surface acoustic wave, (3) the above-described acoustic-velocity-film multilayer structure, (4) a structure in which the elastic wave resonator is an SMR, and (5) a structure in which the elastic wave resonator is an FBAR, and the third filter 13 may have a structure in which a leaky wave that propagates through a piezoelectric layer composed of $LiTaO_3$ is used as a surface acoustic wave.

That is, when a leaky wave in $LiTaO_3$ is used as an elastic wave in the third filter 13 and a leaky wave in $LiTaO_3$ is not used as an elastic wave in the first filter 11, the reflection coefficient of the first filter 11 in the second pass band (the pass band of the second filter 12 on the low frequency side) is able to be increased. Accordingly, an insertion loss resulting from the first filter 11 or/and the third filter 13 in the total insertion loss in the second pass band of the second filter 12 is able to be decreased in the RF front-end circuit.

Figures 10A, 10B:
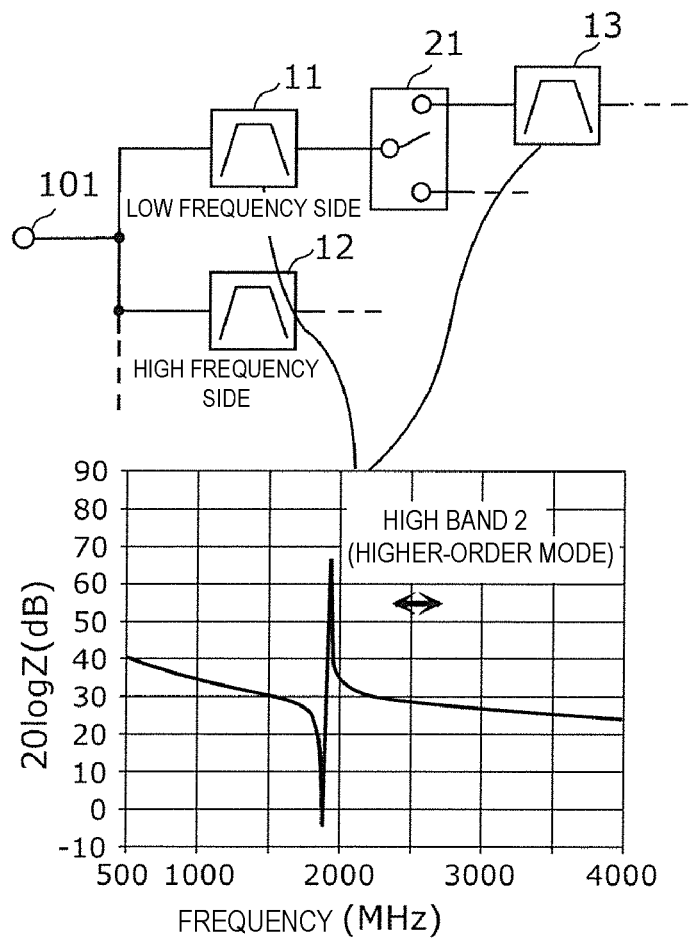
FIG. 10A is a diagram for describing generation of a higher-order mode in a high band of an RF front-end circuit according to a third modification example of the second preferred embodiment of the present invention.
FIG. 10B is a diagram illustrating combinations of configurations of the first filter and the third filter according to the third modification example of the second preferred embodiment of the present invention.

FIG. 10A is a diagram for describing generation of a higher-order mode in a high band 2 of the RF front-end circuit according to a third modification example of the second preferred embodiment. As illustrated in the lower portion of FIG. 10A, in a region on the high frequency side of the resonant point of the elastic wave resonator (high band 2 in FIG. 10A), a higher-order mode is generated at the vicinity of about 1.2 times the resonant frequency, for example, particularly in a structure in which a Rayleigh wave that propagates through a piezoelectric layer composed of LiNbO$_3$ is used as a surface acoustic wave or in a structure in which a Love wave that propagates through a piezoelectric layer composed of LiNbO$_3$ is used as a surface acoustic wave. The generated higher-order mode changes impedance, and the change in impedance causes the reflection coefficient to be decreased.

FIG. 10B is a diagram illustrating combinations of the configurations of the first filter 11 and the third filter 13 according to the third modification example of the second preferred embodiment.

In a case where the first pass band of the first filter 11 is on the low frequency side relative to the second pass band of the second filter 12, the first filter 11 may have any one of (1) the above-described acoustic-velocity-film multilayer structure, (2) a structure in which a leaky wave that propagates through a piezoelectric layer composed of LiTaO$_3$ is used as a surface acoustic wave, (3) a structure in which a Love wave that propagates through a piezoelectric layer composed of LiNbO$_3$ is used as a surface acoustic wave, (4) a structure in which the elastic wave resonator is an SMR, and (5) a structure in which the elastic wave resonator is an FBAR, and the third filter 13 may have a structure in which a Rayleigh wave that propagates through a piezoelectric layer composed of LiNbO$_3$ is used as a surface acoustic wave, as illustrated in FIG. 10B.

That is, when a Rayleigh wave in LiNbO$_3$ is used as an elastic wave in the third filter 13 and a Rayleigh wave in LiNbO$_3$ is not used as an elastic wave in the first filter 11, the reflection coefficient of the first filter 11 in the second pass band (the pass band of the second filter 12 on the high frequency side) is able to be increased. Accordingly, an insertion loss resulting from the first filter 11 or/and the third filter 13 in the total insertion loss in the second pass band of the second filter 12 is able to be decreased in the RF front-end circuit.

Alternatively, as illustrated in FIG. 10B, the first filter 11 may have any one of (1) a structure in which a Rayleigh wave that propagates through a piezoelectric layer composed of LiNbO$_3$ is used as a surface acoustic wave, (2) the above-described acoustic-velocity-film multilayer structure, (3) a structure in which a leaky wave that propagates through a piezoelectric layer composed of LiTaO$_3$ is used as a surface acoustic wave, (4) a structure in which the elastic wave resonator is an SMR, and (5) a structure in which the elastic wave resonator is an FBAR, and the third filter 13 may have a structure in which a Love wave that propagates through a piezoelectric layer composed of LiNbO$_3$ is used as a surface acoustic wave.

That is, when a Love wave in LiNbO$_3$ is used as an elastic wave in the third filter 13 and a Love wave in LiNbO$_3$ is not used as an elastic wave in the first filter 11, the reflection coefficient of the first filter 11 in the second pass band (the pass band of the second filter 12 on the high frequency side) is able to be increased. Accordingly, an insertion loss resulting from the first filter 11 or/and the third filter 13 in the total insertion loss in the second pass band of the second filter 12 is able to be decreased in the RF front-end circuit.

FIG. 11A is a graph illustrating an increase in return loss caused by a higher-order mode in the first filter 11 according to the second preferred embodiment. As illustrated in FIG. 11A, a return loss of the first filter 11 viewed from the antenna common terminal 101 (Port 1) is increased by a higher-order mode on the high frequency side of the resonant point (a broken-line region in FIG. 11A). Here, the frequency at which a returns loss is increased by a higher-order mode is able to be shifted to a high frequency side or low frequency side by changing the structural parameters of the elastic wave resonator. Alternatively, an increase in return loss caused by a higher-order mode is able to be reduced or prevented by changing the structural parameters of the elastic wave resonator.

From this point of view, the inventors have conceived of shifting a frequency at which a higher-order mode or spurious wave is generated to the outside of the pass band of the second filter 12 by changing the structural parameters of the first filter 11 having a greater influence on reflection characteristics, and improving or optimizing the structural parameters to ensure filter characteristics including bandpass characteristics, attenuation characteristics, temperature characteristics, and a bandwidth in the third filter 13 having a smaller influence on reflection characteristics.

FIG. 11B is a diagram illustrating parameters for varying the structures of the first filter 11 and the third filter 13 according to a fourth modification example of the second preferred embodiment.

Each elastic wave resonator included in the first filter 11 is a SAW resonator that includes the substrate 80 including the piezoelectric layer 83 and the IDT electrode 71 disposed on the substrate 80. As illustrated in FIG. 11B, a leaky wave that propagates through a piezoelectric layer composed of LiTaO$_3$ is used as a surface acoustic wave in the first filter 11 and the third filter 13. The electrode film thickness or the duty ratio is different between the IDT electrode 71 included in the first filter 11 and the IDT electrode 71 included in the third filter 13.

In the case of using a leaky wave in LiTaO$_3$ as an elastic wave, a spurious Rayleigh wave is generated on the low frequency side of the resonant frequency of the elastic wave resonator. If the electrode film thickness or duty ratio of the IDT electrode 71 is different between the first filter 11 and the third filter 13, the frequency at which a spurious Rayleigh wave is generated in the first filter 11 is able to be shifted to the outside of the second pass band (the pass band of the second filter 12 on the low frequency side). Accordingly, the reflection coefficient of the first filter 11 in the second pass band (the pass band of the second filter 12 on the low frequency side) is able to be increased, and an insertion loss resulting from the first filter 11 or/and the third filter 13 in the total insertion loss in the second pass band of the second filter 12 is able to be decreased.

As illustrated in FIG. 11B, each elastic wave resonator of the first filter 11 and the third filter 13 may have the above-described acoustic-velocity-film multilayer structure, and any of the electrode film thickness of the IDT electrode 71, the duty ratio of the IDT electrode 71, and the thickness of the low-acoustic-velocity film 82 may be different between the first filter 11 and the third filter 13.

In the case of adopting the acoustic-velocity-film multilayer structure, a spurious Rayleigh wave is generated on the low frequency side of the resonant frequency of the elastic wave resonator. If the electrode film thickness or duty ratio of the IDT electrode 71 is different between the first filter 11 and the third filter 13, the frequency at which a spurious Rayleigh wave is generated in the first filter 11 is able to be shifted to the outside of the second pass band (the pass band of the second filter 12 on the low frequency side). Accordingly, the reflection coefficient of the first filter 11 in the second pass band (the pass band of the second filter 12 on the low frequency side) is able to be increased, and an insertion loss resulting from the first filter 11 or/and the third filter 13 in the total insertion loss in the second pass band of the second filter 12 is able to be decreased.

FIG. 11C is a diagram illustrating parameters for varying the structures of the first filter 11 and the third filter 13 according to a fifth modification example of the second preferred embodiment.

Each elastic wave resonator included in the first filter 11 and the third filter 13 is a SAW resonator that includes the substrate 80 including the piezoelectric layer 83, the IDT electrode 71 disposed on the substrate 80, and the protective film 84 disposed on the IDT electrode 71. As illustrated in FIG. 11C, a Rayleigh wave that propagates through a piezoelectric layer composed of $LiNbO_3$ or a Love wave that propagates through a piezoelectric layer composed of $LiNbO_3$ is used as a surface acoustic wave in the first filter 11 on the low frequency side and the third filter 13. Any one of the electrode film thickness of the IDT electrode 71, the duty ratio of the IDT electrode 71, and the thickness of the protective film 84 is different between the first filter 11 and the third filter 13.

In the case of using a Rayleigh wave in $LiNbO_3$ or a Love wave in $LiNbO_3$ as a surface acoustic wave, a higher-order mode is generated on the high frequency side of the resonant frequency of the elastic wave resonator. If the electrode film thickness of the IDT electrode 71, the duty ratio of the IDT electrode 71, or the thickness of the protective film 84 is different between the first filter 11 and the third filter 13, the frequency at which a higher-order mode is generated in the first filter 11 is able to be shifted to the outside of the second pass band (the pass band of the second filter 12 on the high frequency side). Accordingly, the reflection coefficient of the first filter 11 in the second pass band (the pass band of the second filter 12 on the high frequency side) is able to be increased, and an insertion loss resulting from the first filter 11 or/and the third filter 13 in the total insertion loss in the second pass band of the second filter 12 is able to be decreased.

As illustrated in FIG. 11C, in the first filter 11 and the third filter 13, each elastic wave resonator may have the above-described acoustic-velocity-film multilayer structure, and the high-acoustic-velocity supporting substrate 81 may be composed of a silicon crystal. Any one of the thickness of the piezoelectric layer 83, the thickness of the low-acoustic-velocity film 82, and the silicon crystal orientation of the high-acoustic-velocity supporting substrate 81 may be different between the first filter 11 and the third filter 13.

In the case of adopting the acoustic-velocity-film multilayer structure, a higher-order mode is generated on the high frequency side of the resonant frequency of the elastic wave resonator. If the thickness of the piezoelectric layer 83, the thickness of the low-acoustic-velocity film 82, or the silicon crystal orientation of the high-acoustic-velocity supporting substrate 81 is different between the first filter 11 and the third filter 13, the frequency at which a higher-order mode is generated in the first filter 11 is able to be shifted to the outside of the second pass band (the pass band of the second filter 12 on the high frequency side). Accordingly, the reflection coefficient of the first filter 11 in the second pass band (the pass band of the second filter 12 on the high frequency side) is able to be increased, and an insertion loss resulting from the first filter 11 or/and the third filter 13 in the total insertion loss in the second pass band of the second filter 12 is able to be decreased.

FIG. 12 is a diagram illustrating parameters for varying the structures of the first filter 11 and the third filter 13 according to a sixth modification example of the second preferred embodiment.

Each elastic wave resonator included in the first filter 11 and the third filter 13 is a SAW resonator that includes the substrate 80 including the piezoelectric layer 83 and the IDT electrode 71 disposed on the substrate 80. In the first filter 11 and the third filter 13, a leaky wave that propagates through a piezoelectric layer composed of $LiTaO_3$ or a Love wave that propagates through a piezoelectric layer composed of $LiNbO_3$ is used as a surface acoustic wave. The electrode film thickness of the IDT electrode 71 is different between the first filter 11 and the third filter 13.

In the case of using a leaky wave in $LiTaO_3$ or a Love wave in $LiNbO_3$ as a surface acoustic wave, a bulk wave (unnecessary wave) is generated on the high frequency side of the resonant frequency of the elastic wave resonator. If the electrode film thickness of the IDT electrode 71 is different between the first filter 11 and the third filter 13, the frequency at which a bulk wave is generated in the first filter 11 is able to be shifted to the outside of the second pass band (the pass band of the second filter 12 on the high frequency side). Accordingly, the reflection coefficient of the first filter 11 in the second pass band (the pass band of the second filter 12 on the high frequency side) is able to be increased, and an insertion loss resulting from the first filter 11 or/and the third filter 13 in the total insertion loss in the second pass band of the second filter 12 is able to be decreased.

Third Preferred Embodiment

In a third preferred embodiment of the present invention, a description will be given of a configuration that achieves lower loss and decreased size of an RF front-end circuit that includes demultiplexing circuits connected to an antenna common terminal and filters that are in a subsequent stage of the demultiplexing circuits and are compatible with respective bands.

FIG. 13A is a circuit configuration diagram of an RF front-end circuit 6 according to the third preferred embodiment. The RF front-end circuit 6 illustrated in FIG. 13A includes the antenna common terminal 101, the LB filter 11L, an MB filter 11M, an HB filter 11H, a filter 13b for Band 3, a filter 13f for Band 30, and LNAs 31, 32 and 34.

Each of the LB filter 11L, the MB filter 11M, and the HB filter 11H is a demultiplexing circuit connected to the antenna element.

The LB filter 11L is a low pass filter in which a low band (for example, about 2 GHz or less) is a pass band.

The HB filter 11H is a high pass filter in which a high band (for example, about 2.3 GHz or more) is a pass band.

The MB filter 11M is a band pass filter in which Band 66 (2110-2200 MHz) is a pass band.

The filter 13b is a band pass filter in which Band 3 (1805-1880 MHz) is a pass band.

The filter 13f is a band pass filter in which Band 30 (2350-2360 MHz) is a pass band.

Here, the pass band of Band 66 (2110-2200 MHz) includes the pass band of Band 1 (2110-2170 MHz) and the pass band of Band 4 (2110-2155 MHz).

Accordingly, the signal propagation path for Band 66 can also be used as the signal propagation paths for Band 1 and Band 4. That is, RF signals in Band 1 and Band 4 propagate through the signal path extending from the MB filter 11M to the LNA 31.

In the above-described circuit configuration, a CA operation may be performed in the combination of Band 1 and Band 3 and the combination of Band 4 and Band 30. A CA operation is not performed in the combination of Band 1 and Band 4, where frequency bands overlap each other.

FIG. 13B is a circuit configuration diagram of an RF front-end circuit 600 according to a comparative example.

The RF front-end circuit 600 according to the comparative example is used, in the related art, as a circuit configuration for performing a CA operation in Band 1 and Band 3 and a CA operation in Band 4 and Band 30. The RF front-end circuit 600 includes the antenna common terminal 101, the switch 21, a filter 13p for Band 1, the filter 13b for Band 3, a filter 13p for Band 4, the filter 13f for Band 30, and LNAs 31, 32, 31, and 34. In this configuration, a CA operation in Band 1 and Band 3 or a CA operation in Band 4 and Band 30 is selected by switching of the switch 21.

In the case of performing such a CA operation, it is a typical case that the filter 13p for Band 1 and the filter 13p for Band 4 are separately prepared and switching therebetween is performed by using the switch 21, as in the comparative example. However, since the pass bands of Band 1 and Band 4 overlap each other in a wide range, the wideband MB filter 11M may replace the two filters as in the RF front-end circuit 6 according to the third preferred embodiment. In contrast, in the comparative example, a larger area is occupied uselessly.

That is, in the RF front-end circuit 6 according to the third preferred embodiment, RF signals in Band 1 and Band 4 can share the MB filter 11M in which Band 66 is a pass band. Accordingly, a single band pass filter is able to be applied to pass bands of a plurality of bands, and thus the space is saved. Furthermore, the number of filters through which RF signals in Band 1 and Band 4 pass is able to be decreased, and thus propagation loss of RF signals is able to be decreased.

Other Modification Examples

The multiplexer, RF front-end circuit, and communication device according to preferred embodiments and modification examples of the present invention have been described above. Other preferred embodiments that are implemented by combining any selected elements or features of the above-described preferred embodiments and modification examples, modification examples obtained by applying, to the above-described preferred embodiments, various changes conceived of by those skilled in the art without deviating from the gist of the present invention, and various apparatuses including the RF front-end circuit and communication device according to the preferred embodiments of the present invention are also included in the scope of the present invention.

For example, a dual demultiplexing/multiplexing circuit in which two reception signal paths are connected in common to a common terminal has been described above as a multiplexer, but a preferred embodiment of the present invention can also be applied to, for example, a circuit including both a transmission path and a reception path or a demultiplexing/multiplexing circuit in which three or more signal paths are connected in common to a common terminal.

In each filter included in a multiplexer, an inductor or capacitor may be connected between individual terminals, such as an input/output terminal and a ground terminal, or a circuit element other than an inductor and capacitor, such as a resistor, may be provided.

A multiplexer, RF front-end circuit, and communication device according to preferred embodiments of the present invention which are compact, low in cost and loss, and applicable to the multiband and multimode frequency standard, are able to be widely applied to communication apparatuses such as cellular phones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A radio-frequency front-end circuit comprising:
   an antenna common terminal connected to an antenna element;
   a first input/output terminal and a second input/output terminal;
   a first filter that includes a first terminal and a second terminal and has a first pass band, the first terminal being connected to the antenna common terminal;
   a second filter that is connected to the antenna common terminal, is disposed between the antenna common terminal and the second input/output terminal, and has a second pass band different from the first pass band;
   a switch that includes a common terminal and a plurality of selection terminals, the common terminal being connected to the second terminal; and
   a third filter that is connected to a first selection terminal among the plurality of selection terminals and is disposed between the switch and the first input/output terminal; wherein
   a reflection coefficient of the first filter alone in the second pass band viewed from the antenna common terminal is larger than a reflection coefficient of the third filter alone in the second pass band viewed from the antenna common terminal.

2. The radio-frequency front-end circuit according to claim 1, wherein
   each of the first filter and the third filter includes two or more elastic wave resonators; and
   a reflection coefficient of one or more elastic wave resonators alone disposed near the antenna common terminal among the two or more elastic wave resonators included in the first filter in the second pass band viewed from the antenna common terminal is larger than a reflection coefficient of one or more elastic wave resonators alone disposed near the antenna common terminal among the two or more elastic wave resonators included in the third filter in the second pass band viewed from the antenna common terminal.

3. The radio-frequency front-end circuit according to claim 1, wherein
   at least one of the first filter and the third filter has a ladder filter structure; and
   the one or more elastic wave resonators disposed near the antenna common terminal include at least one of a series-arm resonator and a parallel-arm resonator.

4. The radio-frequency front-end circuit according to claim 1, wherein at least one of the first filter and the third filter has a longitudinally coupled filter structure.

5. The radio-frequency front-end circuit according to claim 1, wherein
   the second input/output terminal is connected to a second amplifying circuit; and
   no filter circuit is disposed between the second filter and the second amplifying circuit.

6. The radio-frequency front-end circuit according to claim 1, further comprising:
   a third input/output terminal; and a fourth filter that is connected to the antenna common terminal, is disposed between the antenna common terminal and the third input/output terminal, and has a third pass band; wherein the first filter, the second filter, and the fourth filter define a triplexer;

the first pass band, the second pass band, and the third pass band are applied to a low band of about 698-960 MHz, a middle band of about 1710-2200 MHz, and a high band of about 2300-2690 MHz; and the first pass band is any one of the low band, the middle band, and the high band.

7. The radio-frequency front-end circuit according to claim 1, further comprising:

a third input/output terminal and a fourth input/output terminal;

a fourth filter that is connected to the antenna common terminal, is disposed between the antenna common terminal and the third input/output terminal, and has a third pass band; and a fifth filter that is connected to the antenna common terminal, is disposed between the antenna common terminal and the fourth input/output terminal, and has a fourth pass band; wherein the first filter, the second filter, the fourth filter, and the fifth filter define a quadplexer;

the first pass band, the second pass band, the third pass band, and the fourth pass band are applied to a low band of about 698-960 MHz, a middle band of about 1710-2200 MHz, a middle high band of about 2300-2400 MHz, and a high band of about 2496-2690 MHz; and the first pass band is any one of the low band, the middle band, the middle high band, and the high band.

8. The radio-frequency front-end circuit according to claim 1, further comprising:

a third input/output terminal and a fourth input/output terminal;

a fourth filter that is connected to the antenna common terminal, is disposed between the antenna common terminal and the third input/output terminal, and has a third pass band; and a fifth filter that is connected to the antenna common terminal, is disposed between the antenna common terminal and the fourth input/output terminal, and has a fourth pass band; wherein the first filter, the second filter, the fourth filter, and the fifth filter define a quadplexer;

the first pass band, the second pass band, the third pass band, and the fourth pass band are applied to a middle low band of about 1475.9-2025 MHz, a middle band of about 2110-2200 MHz, a middle high band of about 2300-2400 MHz or about 2300-2370 MHz, and a high band of about 2496-2690 MHz; and the first pass band is any one of the middle low band, the middle band, the middle high band, and the high band.

9. The radio-frequency front-end circuit according to claim 5, further comprising:

a third input/output terminal and a fourth input/output terminal;

a fourth filter that is connected to the antenna common terminal, is disposed between the antenna common terminal and the third input/output terminal, and has a third pass band; and a fifth filter that is connected to the antenna common terminal, is disposed between the antenna common terminal and the fourth input/output terminal, and has a fourth pass band; wherein the first filter, the second filter, the fourth filter, and the fifth filter define a quadplexer;

the first pass band, the second pass band, the third pass band, and the fourth pass band are applied to a middle low band of about 1475.9-2025 MHz, a middle band of about 2110-2200 MHz, a middle high band of about 2300-2400 MHz or about 2300-2370 MHz, and a high band of about 2496-2690 MHz;

the first pass band is any one of the middle low band, the middle band, and the high band;

the second pass band is the middle high band; and no filter circuit is disposed on a signal path connecting the second filter and the second amplifying circuit.

10. The radio-frequency front-end circuit according to claim 9, wherein the signal path connecting the second filter and the second amplifying circuit is a path that performs transmission and reception in Band 40*a* having a reception band of 2300-2370 MHz.

11. The radio-frequency front-end circuit according to claim 9, wherein the signal path connecting the second filter and the second amplifying circuit is a path that performs transmission and reception in Band 40 having a reception band of 2300-2400 MHz.

12. The radio-frequency front-end circuit according to claim 5, further comprising:

a third input/output terminal and a fourth input/output terminal;

a fourth filter that is connected to the antenna common terminal, is disposed between the antenna common terminal and the third input/output terminal, and has a third pass band; and a fifth filter that is connected to the antenna common terminal, is disposed between the antenna common terminal and the fourth input/output terminal, and has a fourth pass band; wherein the first filter, the second filter, the fourth filter, and the fifth filter define a quadplexer;

the first pass band, the second pass band, the third pass band, and the fourth pass band are applied to a middle low band of about 1475.9-2025 MHz, a middle band of about 2110-2200 MHz, a middle high band of about 2300-2400 MHz or about 2300-2370 MHz, and a high band of about 2496-2690 MHz;

the first pass band is any one of the middle low band, the middle band, and the middle high band;

the second pass band is the high band; and no filter circuit is disposed on a signal path connecting the second filter and the second amplifying circuit.

13. The radio-frequency front-end circuit according to claim 10, wherein the signal path connecting the second filter and the second amplifying circuit is a path that performs transmission and reception in Band 41 having a reception band of about 2496-2690 MHz.

14. The radio-frequency front-end circuit according to claim 1, wherein the first pass band is on a high frequency side relative to the second pass band;

each of the first filter and the third filter includes one or more elastic wave resonators;

each of the one or more elastic wave resonators included in the first filter is a surface acoustic wave resonator that includes a substrate including a piezoelectric layer and an interdigital transducer (IDT) electrode disposed on the substrate; and in the first filter, any one of (1) a Rayleigh wave that propagates through the piezoelectric layer composed of $LiNbO_3$, (2) a leaky wave that propagates through the piezoelectric layer composed of LiTaO$_3$, and (3) a Love wave that propagates through the piezoelectric layer composed of LiNbO$_3$ is used as a surface acoustic wave.

15. The radio-frequency front-end circuit according to claim 14, wherein in the third filter, each of the one or more elastic wave resonators is a solidly mounted resonator (SMR) or a film bulk acoustic resonator (FBAR).

16. The radio-frequency front-end circuit according to claim 1, wherein
the first pass band is on a high frequency side relative to the second pass band;
each of the first filter and the third filter includes one or more elastic wave resonators;
each of the one or more elastic wave resonators included in the first filter is a surface acoustic wave resonator that includes a substrate including a piezoelectric layer and an interdigital transducer (IDT) electrode disposed on the substrate;
in the first filter, each of the one or more elastic wave resonators has an acoustic-velocity-film multilayer structure including (i) the piezoelectric layer including main surfaces, the IDT electrode being disposed on one of the main surfaces, (ii) a high-acoustic-velocity supporting substrate through which a bulk wave propagates at an acoustic velocity higher than an acoustic velocity of an elastic wave that propagates through the piezoelectric layer, and (iii) a low-acoustic-velocity film which is disposed between the high-acoustic-velocity supporting substrate and the piezoelectric layer and through which a bulk wave propagates at an acoustic velocity lower than an acoustic velocity of an elastic wave that propagates through the piezoelectric layer; and
in the third filter, each of the one or more elastic wave resonators is a solidly mounted resonator (SMR) or a film bulk acoustic resonator (FBAR).

17. The radio-frequency front-end circuit according to claim 1, wherein
the first pass band is on a low frequency side relative to the second pass band;
each of the first filter and the third filter includes one or more elastic wave resonators; and
in the first filter, (1) a Rayleigh wave that propagates through a piezoelectric layer composed of LiNbO$_3$ is used as a surface acoustic wave, (2) each of the one or more elastic wave resonators is a solidly mounted resonator (SMR), or (3) each of the one or more elastic wave resonators is a film bulk acoustic resonator (FBAR).

18. The radio-frequency front-end circuit according to claim 17, wherein
in the third filter, (1) each of the one or more elastic wave resonators has an acoustic-velocity-film multilayer structure including (i) a piezoelectric layer including main surfaces, an interdigital transducer (IDT) electrode being disposed on one of the main surfaces, (ii) a high-acoustic-velocity supporting substrate through which a bulk wave propagates at an acoustic velocity higher than an acoustic velocity of an elastic wave that propagates through the piezoelectric layer, and (iii) a low-acoustic-velocity film which is disposed between the high-acoustic-velocity supporting substrate and the piezoelectric layer and through which a bulk wave propagates at an acoustic velocity lower than an acoustic velocity of an elastic wave that propagates through the piezoelectric layer, (2) a leaky wave that propagates through the piezoelectric layer composed of LiTaO$_3$ is used as a surface acoustic wave, or (3) a Love wave that propagates through the piezoelectric layer composed of LiNbO$_3$ is used as a surface acoustic wave.

19. The radio-frequency front-end circuit according to claim 1, wherein
the first pass band is on a low frequency side relative to the second pass band;
each of the first filter and the third filter includes one or more elastic wave resonators;
each of the one or more elastic wave resonators included in the first filter and the third filter is a surface acoustic wave resonator that includes a substrate including a piezoelectric layer and an interdigital transducer (IDT) electrode disposed on the substrate;
in the first filter, each of the one or more elastic wave resonators has an acoustic-velocity-film multilayer structure including (i) the piezoelectric layer including main surfaces, the IDT electrode being disposed on one of the main surfaces, (ii) a high-acoustic-velocity supporting substrate through which a bulk wave propagates at an acoustic velocity higher than an acoustic velocity of an elastic wave that propagates through the piezoelectric layer, and (iii) a low-acoustic-velocity film which is disposed between the high-acoustic-velocity supporting substrate and the piezoelectric layer and through which a bulk wave propagates at an acoustic velocity lower than an acoustic velocity of an elastic wave that propagates through the piezoelectric layer; and
in the third filter, (1) a leaky wave that propagates through the piezoelectric layer composed of LiTaO$_3$ is used as a surface acoustic wave or (2) a Love wave that propagates through the piezoelectric layer composed of LiNbO$_3$ is used as a surface acoustic wave.

20. The radio-frequency front-end circuit according to claim 1, wherein
the first pass band is on a low frequency side relative to the second pass band;
each of the first filter and the third filter includes one or more elastic wave resonators;
each of the one or more elastic wave resonators included in the first filter and the third filter is a surface acoustic wave resonator that includes a substrate including a piezoelectric layer and an interdigital transducer (IDT) electrode disposed on the substrate;
in the first filter, a leaky wave that propagates through the piezoelectric layer composed of LiTaO$_3$ is used as a surface acoustic wave; and
in the third filter, a Love wave that propagates through the piezoelectric layer composed of LiNbO$_3$ is used as a surface acoustic wave.

21. The radio-frequency front-end circuit according to claim 1, wherein
the first pass band is on a high frequency side relative to the second pass band;
each of the first filter and the third filter includes one or more elastic wave resonators;
in the first filter, (1) a Rayleigh wave that propagates through a piezoelectric layer composed of LiNbO$_3$ is used as a surface acoustic wave, (2) a leaky wave that propagates through the piezoelectric layer composed of LiTaO$_3$ is used as a surface acoustic wave, (3) a Love wave that propagates through the piezoelectric layer composed of LiNbO$_3$ is used as a surface acoustic wave, (4) each of the one or more elastic wave resonators is a solidly mounted resonator (SMR), or (5)

each of the one or more elastic wave resonators is a film bulk acoustic resonator (FBAR); and in the third filter, each of the one or more elastic wave resonators has an acoustic-velocity-film multilayer structure including (i) a piezoelectric layer including main surfaces, an interdigital transducer (IDT) electrode being disposed on one of the main surfaces, (ii) a high-acoustic-velocity supporting substrate through which a bulk wave propagates at an acoustic velocity higher than an acoustic velocity of an elastic wave that propagates through the piezoelectric layer, and (iii) a low-acoustic-velocity film which is disposed between the high-acoustic-velocity supporting substrate and the piezoelectric layer and through which a bulk wave propagates at an acoustic velocity lower than an acoustic velocity of an elastic wave that propagates through the piezoelectric layer.

22. The radio-frequency front-end circuit according to claim 1, wherein the first pass band is on a high frequency side relative to the second pass band;

each of the first filter and the third filter includes one or more elastic wave resonators;

in the first filter, (1) a Rayleigh wave that propagates through a piezoelectric layer composed of $LiNbO_3$ is used as a surface acoustic wave, (2) a Love wave that propagates through the piezoelectric layer composed of $LiNbO_3$ is used as a surface acoustic wave, (3) each of the one or more elastic wave resonators has an acoustic-velocity-film multilayer structure including (i) a piezoelectric layer including main surfaces, an interdigital transducer (IDT) electrode being disposed on one of the main surfaces, (ii) a high-acoustic-velocity supporting substrate through which a bulk wave propagates at an acoustic velocity higher than an acoustic velocity of an elastic wave that propagates through the piezoelectric layer, and (iii) a low-acoustic-velocity film which is disposed between the high-acoustic-velocity supporting substrate and the piezoelectric layer and through which a bulk wave propagates at an acoustic velocity lower than an acoustic velocity of an elastic wave that propagates through the piezoelectric layer, (4) each of the one or more elastic wave resonators is a solidly mounted resonator (SMR), or (5) each of the one or more elastic wave resonators is a film bulk acoustic resonator (FBAR); and in the third filter, a leaky wave that propagates through the piezoelectric layer composed of $LiTaO_3$ is used as a surface acoustic wave.

23. The radio-frequency front-end circuit according to claim 1, wherein the first pass band is on a low frequency side relative to the second pass band;

each of the first filter and the third filter includes one or more elastic wave resonators;

in the first filter, (1) each of the one or more elastic wave resonators has an acoustic-velocity-film multilayer structure including (i) a piezoelectric layer including main surfaces, an interdigital transducer (IDT) electrode being disposed on one of the main surfaces, (ii) a high-acoustic-velocity supporting substrate through which a bulk wave propagates at an acoustic velocity higher than an acoustic velocity of an elastic wave that propagates through the piezoelectric layer, and (iii) a low-acoustic-velocity film which is disposed between the high-acoustic-velocity supporting substrate and the piezoelectric layer and through which a bulk wave propagates at an acoustic velocity lower than an acoustic velocity of an elastic wave that propagates through the piezoelectric layer, (2) a leaky wave that propagates through the piezoelectric layer composed of $LiTaO_3$ is used as a surface acoustic wave, (3) a Love wave that propagates through the piezoelectric layer composed of $LiNbO_3$ is used as a surface acoustic wave, (4) each of the one or more elastic wave resonators is a solidly mounted resonator (SMR), or (5) each of the one or more elastic wave resonators is a film bulk acoustic resonator (FBAR); and in the third filter, a Rayleigh wave that propagates through the piezoelectric layer composed of $LiNbO_3$ is used as a surface acoustic wave.

24. The radio-frequency front-end circuit according to claim 1, wherein the first pass band is on a low frequency side relative to the second pass band;

each of the first filter and the third filter includes one or more elastic wave resonators;

in the first filter, (1) a Rayleigh wave that propagates through a piezoelectric layer composed of $LiNbO_3$ is used as a surface acoustic wave, (2) each of the one or more elastic wave resonators has an acoustic-velocity-film multilayer structure including (i) a piezoelectric layer including main surfaces, an interdigital transducer (IDT) electrode being disposed on one of the main surfaces, (ii) a high-acoustic-velocity supporting substrate through which a bulk wave propagates at an acoustic velocity higher than an acoustic velocity of an elastic wave that propagates through the piezoelectric layer, and (iii) a low-acoustic-velocity film which is disposed between the high-acoustic-velocity supporting substrate and the piezoelectric layer and through which a bulk wave propagates at an acoustic velocity lower than an acoustic velocity of an elastic wave that propagates through the piezoelectric layer, (3) a leaky wave that propagates through the piezoelectric layer composed of $LiTaO_3$ is used as a surface acoustic wave, (4) each of the one or more elastic wave resonators is a solidly mounted resonator (SMR), or (5) each of the one or more elastic wave resonators is a film bulk acoustic resonator (FBAR); and in the third filter, a Love wave that propagates through the piezoelectric layer composed of $LiNbO_3$ is used as a surface acoustic wave.

25. The radio-frequency front-end circuit according to claim 1, wherein each of the two or more elastic wave resonators included in the first filter and the third filter is a surface acoustic wave resonator that includes a substrate including a piezoelectric layer and an interdigital transducer (IDT) electrode disposed on the substrate;

in the first filter and the third filter, a leaky wave that propagates through the piezoelectric layer composed of $LiTaO_3$ is used as a surface acoustic wave; and a film thickness or a duty ratio is different between the IDT electrode included in the first filter and the IDT electrode included in the third filter.

26. The radio-frequency front-end circuit according to claim 1, wherein each of the two or more elastic wave resonators included in the first filter and the third filter is a surface acoustic wave resonator that includes a substrate including a piezoelectric layer and an interdigital transducer (IDT) electrode disposed on the substrate;

in the first filter and the third filter, each of the two or more elastic wave resonators has an acoustic-velocity-film multilayer structure including (i) the piezoelectric layer including main surfaces, the IDT electrode being disposed on one of the main surfaces, (ii) a high-acoustic-velocity supporting substrate through which a bulk wave propagates at an acoustic velocity higher than an acoustic velocity of an elastic wave that propagates through the piezoelectric layer, and (iii) a low-acoustic-velocity film which is disposed between the high-acoustic-velocity supporting substrate and the piezoelectric layer and through which a bulk wave propagates at an acoustic velocity lower than an acoustic velocity of an elastic wave that propagates through the piezoelectric layer; and any one of a film thickness of the IDT electrode, a duty ratio of the IDT electrode, and a film thickness of the low-acoustic-velocity film is different between the first filter and the third filter.

27. The radio-frequency front-end circuit according to claim 1, wherein each of the two or more elastic wave resonators included in the first filter and the third filter is a surface acoustic wave resonator that includes a substrate including a piezoelectric layer, an interdigital transducer (IDT) electrode disposed on the substrate, and a protective film disposed on the IDT electrode;

in the first filter and the third filter, (1) a Rayleigh wave that propagates through the piezoelectric layer composed of $LiNbO_3$ or (2) a Love wave that propagates through the piezoelectric layer composed of $LiNbO_3$ is used as a surface acoustic wave; and any one of a film thickness of the IDT electrode, a duty ratio of the IDT electrode, and a film thickness of the protective film is different between the first filter and the third filter.

28. The radio-frequency front-end circuit according to claim 1, wherein each of the two or more elastic wave resonators included in the first filter and the third filter is a surface acoustic wave resonator that includes a substrate including a piezoelectric layer and an interdigital transducer (IDT) electrode disposed on the substrate;

in the first filter and the third filter, each of the two or more elastic wave resonators has an acoustic-velocity-film multilayer structure including (i) the piezoelectric layer including main surfaces, the IDT electrode being disposed on one of the main surfaces, (ii) a high-acoustic-velocity supporting substrate through which a bulk wave propagates at an acoustic velocity higher than an acoustic velocity of an elastic wave that propagates through the piezoelectric layer, and (iii) a low-acoustic-velocity film which is disposed between the high-acoustic-velocity supporting substrate and the piezoelectric layer and through which a bulk wave propagates at an acoustic velocity lower than an acoustic velocity of an elastic wave that propagates through the piezoelectric layer;

the high-acoustic-velocity supporting substrate is composed of a silicon crystal; and any one of a film thickness of the piezoelectric layer, a film thickness of the low-acoustic-velocity film, and a silicon crystal orientation of the high-acoustic-velocity supporting substrate is different between the first filter and the third filter.

29. The radio-frequency front-end circuit according to claim 1, wherein each of the two or more elastic wave resonators included in the first filter and the third filter is a surface acoustic wave resonator that includes a substrate including a piezoelectric layer and an interdigital transducer (IDT) electrode disposed on the substrate;

in the first filter and the third filter, (1) a leaky wave that propagates through the piezoelectric layer composed of $LiTaO_3$ or (2) a Love wave that propagates through the piezoelectric layer composed of $LiNbO_3$ is used as a surface acoustic wave; and a film thickness of the IDT electrode is different between the first filter and the third filter.

30. The radio-frequency front-end circuit according to claim 1, further comprising:

a first amplifying circuit connected to the first input/output terminal; and a second amplifying circuit connected to the second input/output terminal.

\* \* \* \* \*